(12) United States Patent
Liu et al.

(10) Patent No.: US 11,948,969 B2
(45) Date of Patent: Apr. 2, 2024

(54) SEMICONDUCTOR STRUCTURE AND METHOD OF MANUFACTURING THE SAME

(71) Applicant: TAIWAN SEMICONDUCTOR MANUFACTURING COMPANY LTD., Hsinchu (TW)

(72) Inventors: Ming Chyi Liu, Hsinchu (TW); Chun-Tsung Kuo, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 151 days.

(21) Appl. No.: 17/461,308

(22) Filed: Aug. 30, 2021

(65) Prior Publication Data
US 2023/0067299 A1    Mar. 2, 2023

(51) Int. Cl.
H10B 12/00    (2023.01)
H01L 49/02    (2006.01)

(52) U.S. Cl.
CPC .............. *H01L 28/91* (2013.01); *H01L 28/87* (2013.01); *H10B 12/0383* (2023.02)

(58) Field of Classification Search
CPC ......... H01L 28/90–92; H01L 29/66181; H01L 29/945; H01L 29/0649; H01L 21/7682; H01L 21/764; H01L 21/76807; H01L 21/76808; H01L 21/76816; H01L 2221/1042; H01L 2221/1015; H01L 2221/1026; H01L 23/5223; H10B 12/03–0335; H10B 12/0383

See application file for complete search history.

(56) References Cited

U.S. PATENT DOCUMENTS

| | | | | |
|---|---|---|---|---|
| 2007/0232011 A1* | 10/2007 | Gogoi | ................. | H01L 27/0805 257/E27.048 |
| 2015/0102461 A1* | 4/2015 | Lee | ........................ | H10B 12/09 257/532 |
| 2015/0214293 A1* | 7/2015 | Liao | ........................ | H01L 28/91 257/532 |

FOREIGN PATENT DOCUMENTS

TW    I741566 B    10/2021

OTHER PUBLICATIONS

U.S. Pat. No. 11,380,708 B2 is the US counterpart of TW I741566 B.

* cited by examiner

*Primary Examiner* — Jose R Diaz
(74) *Attorney, Agent, or Firm* — WPAT LAW; Anthony King

(57) ABSTRACT

A semiconductor structure includes a substrate, at least one dielectric layer and a capacitor structure. The at least one dielectric layer is disposed over the substrate, and the at least one dielectric layer includes a step edge profile. The capacitor structure is disposed over the substrate. The capacitor structure includes a bottom electrode, a capacitor dielectric layer and a top electrode. The bottom electrode covers the step edge profile of the at least one dielectric layer and has a first step profile substantially conformal to the step edge profile of the at least one dielectric layer. The capacitor dielectric layer covers the bottom electrode and has a second step profile substantially conformal to the first step profile. The top electrode covers the capacitor dielectric layer.

20 Claims, 20 Drawing Sheets

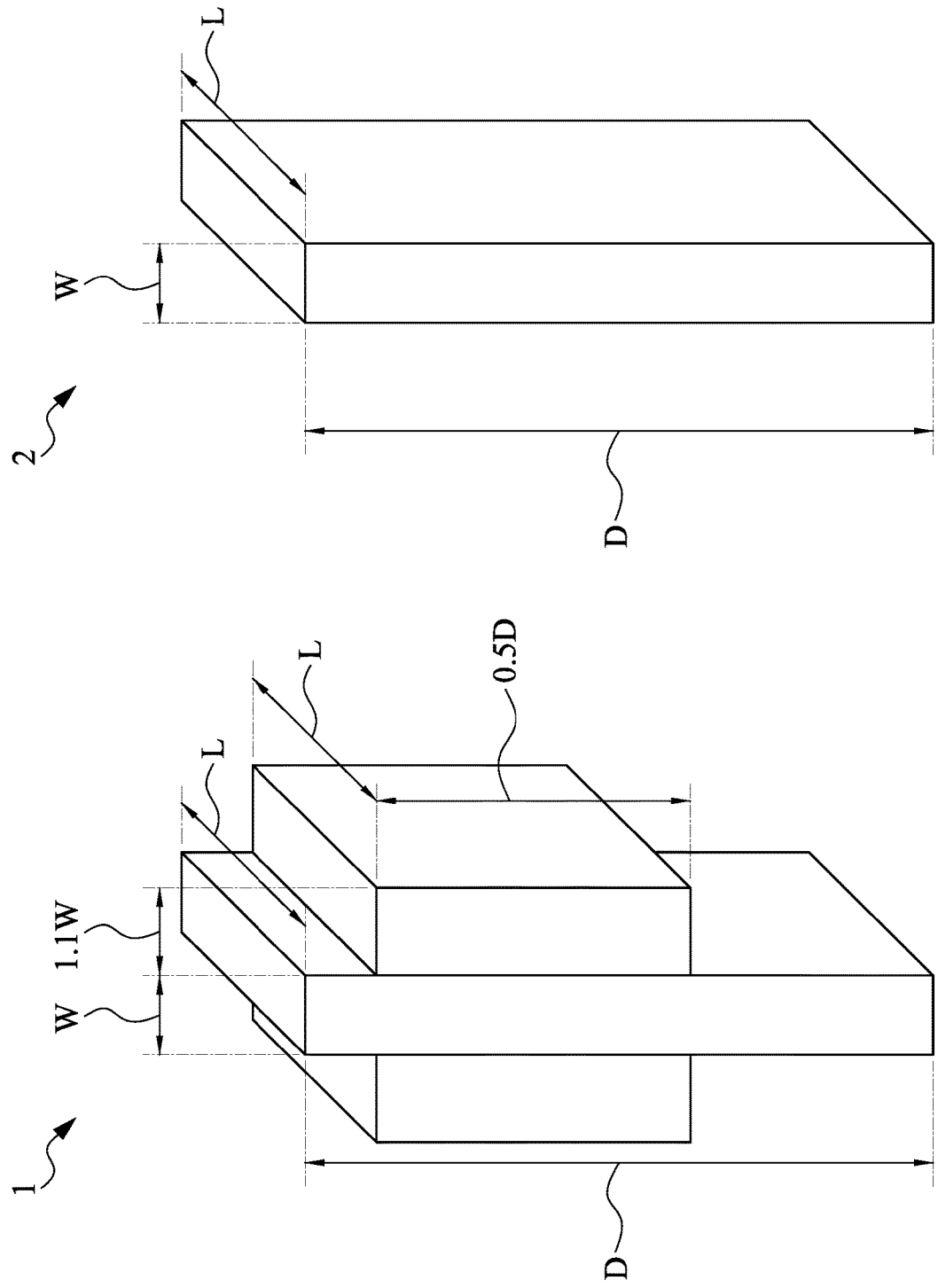

SEMICONDUCTOR STRUCTURE AND METHOD OF MANUFACTURING THE SAME

BACKGROUND

In recent years, the scaling of features in integrated circuits has been one of the goals in the semiconductor industry. Scaling to smaller features enables increased densities of functional units on the limited real estate of semiconductor chips. As semiconductor devices have become highly integrated, a metal-insulator-metal (MIM) capacitor having a higher capacitance per unit of chip area is popular. The MIM capacitor is widely used for applications such as an analog to digital (AD) converter, a RF device, a switching capacitor filter, and a CMOS image sensor (CIS). To meet the requirements of high integration, an integrated circuit of a semiconductor device has been proposed with a stacked MIM capacitor, which has a high capacitance per unit of chip area. The capacitance of the stacked MIM capacitor, however, has its limit, and a high density NIM capacitor is thus expected.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

FIG. 3A is a simplified schematic diagram of a semiconductor structure in left half FIG. 3.

FIG. 3B is a simplified schematic diagram of a semiconductor structure in right portion FIG. 3.

DETAILED DESCRIPTION

Figure 1:
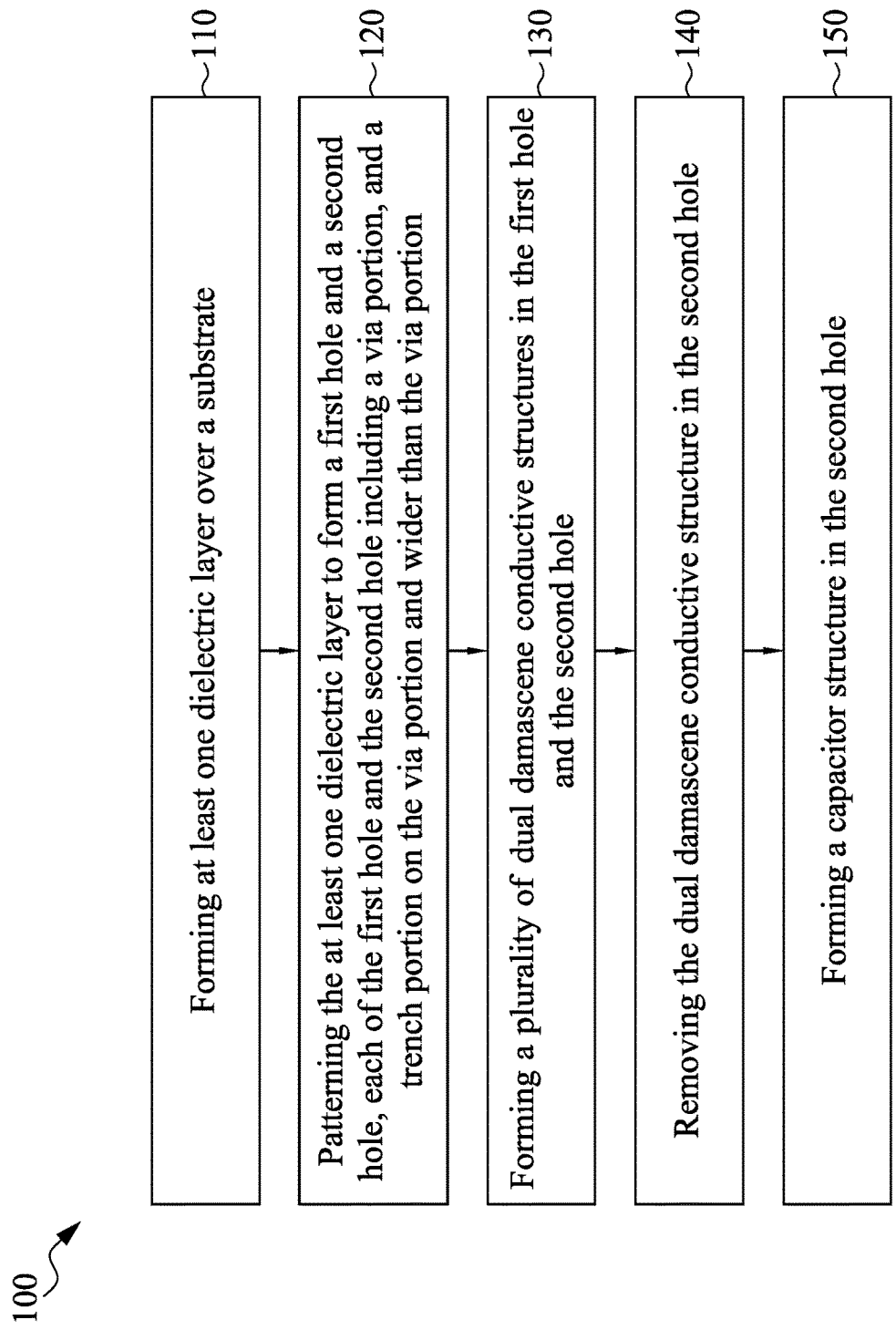
FIG. 1 is a flow chart illustrating a method for manufacturing a semiconductor structure according to various aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation.

In one or more embodiments of the present disclosure, a three-dimensional (3D) capacitor structure and manufacturing method thereof are provided. The 3D capacitor structure includes lateral protrusions that can increase the overlapping area, and thus the capacitance can be enhanced by more than 30%. The 3D capacitor structure can be integrated into the manufacturing operations of the dual damascene conductive structure, and thus manufacturing costs and complexity can be reduced.

FIG. 1 is a flow chart illustrating a method for manufacturing a semiconductor structure according to various aspects of one or more embodiments of the present disclosure. The method 100 begins with operation 110 in which at least one dielectric layer is formed over a substrate. The method 100 proceeds with operation 120 in which the at least one dielectric layer is patterned to form a first hole and a second hole. Each of the first hole and the second hole includes a via portion, and a trench portion on the via portion and wider than the via portion. The method 100 continues with operation 130 in which a plurality of dual damascene conductive structures are formed in the first hole and the second hole. The method 100 proceeds with operation 140 in which the dual damascene conductive structure in the second hole is removed. The method continues with operation 150 in which a capacitor structure is formed in the second hole.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2A:
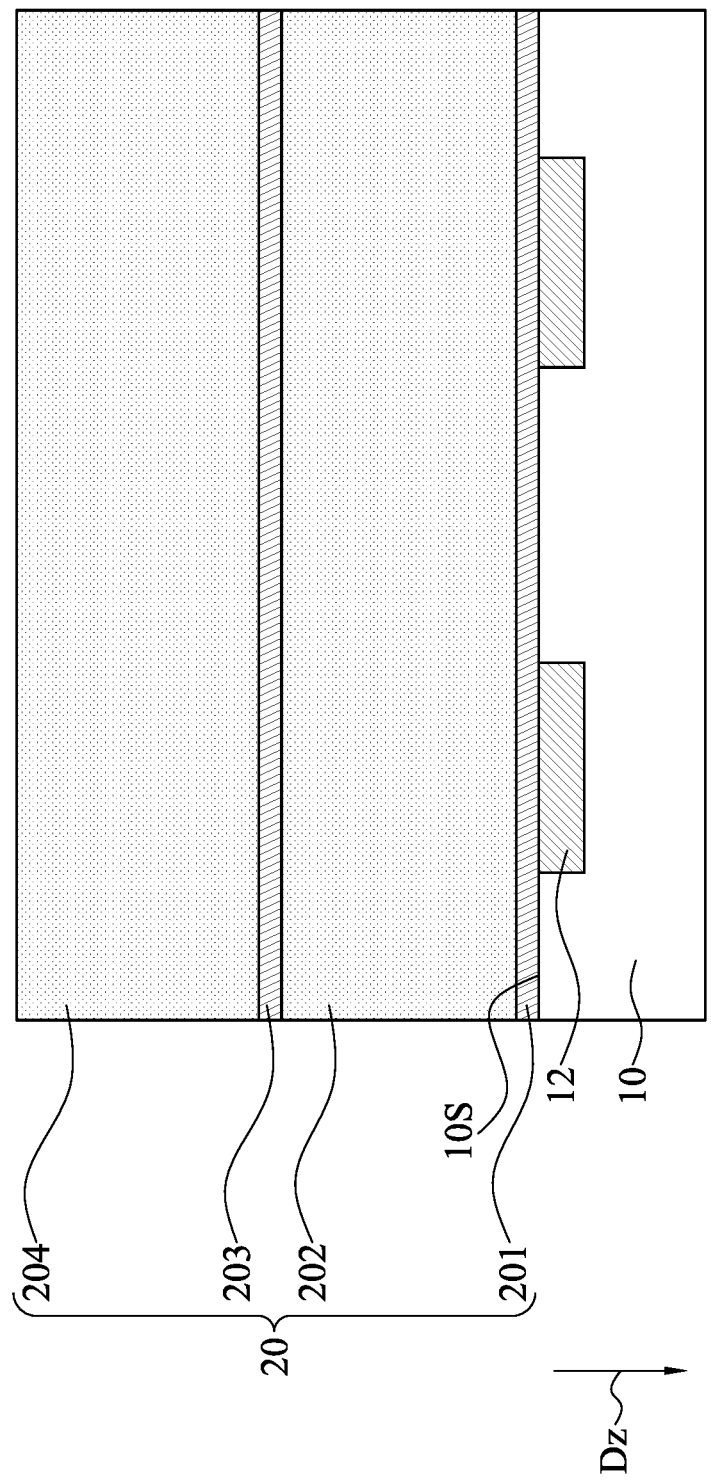
FIG. 2A, FIG. 2B, FIG. 2C, FIG. 2D, FIG. 2E, FIG. 2F, FIG. 2G and FIG. 2H are schematic views at one of various operations of manufacturing a semiconductor structure according to one or more embodiments of the present disclosure.

FIG. 2A, FIG. 2B, FIG. 2C, FIG. 2D, FIG. 2E, FIG. 2F, FIG. 2G and FIG. 2H are schematic views at one of various operations of manufacturing a semiconductor structure according to one or more embodiments of the present disclosure. Referring to FIG. 2A, a substrate 10 is received. The substrate 10 may, but is not limited to be, a semiconductor substrate. The substrate 10 may include a bulk substrate or a composite substrate. In some embodiments, the material of the substrate 10 may comprise elementary semiconductor such as silicon or germanium. In some embodiments, the material of the substrate 10 may include a compound semiconductor such as III-V compound semiconductor. By way of example, the III-V compound semiconductor may include gallium arsenic (GaAs), gallium phosphide (GaP), indium phosphide (InP), indium arsenide (InAs), other III-V compound semiconductors, or a combination thereof. In some embodiments, the substrate 10 may be doped, or un-doped. The substrate 10 includes a surface 10S (e.g., an active surface) on which electronic and/or semiconductor devices such as active devices, passive devices or the like are formed. In some embodiments, driving devices such as metal-oxide semiconductor (MOS) transistors (not shown) may be formed adjacent to the surface 10S of the substrate 10. In some embodiments, an interconnection layer (not shown) including one or more conductive layers and one or more inter-dielectric layers may be formed over the substrate 10, and electrically connected to the driving devices. By way of example, a first conductive layer 12 such as a copper layer of the interconnection layer is shown in FIG. 2A. The first conductive layer 12 may be configured as an electrical contact such as a bottom via to electrically connect a capacitor structure to be formed to the driving device.

Subsequently, at least one dielectric layer 20 is formed over the substrate 10. In some embodiments, the at least one dielectric layer 20 may be parts of the interconnection layer, and covers the first conductive layer 12. By way of example, the at least one dielectric layer 20 may be a composite layer including a first etch stop layer 201, a first dielectric layer 202, a second etch stop layer 203 and a second dielectric layer 204 stacked on the substrate 10. The material of the composite layer may include dielectric material such as silicon oxide, silicon nitride, silicon carbide and silicon oxynitride, and semiconductive material such as polycrystalline silicon. For example, the first etch stop layer 201 and the second etch stop layer 203 may include silicon nitride, and the first dielectric layer 202 and the second dielectric layer 204 may include silicon oxide.

Figure 2B:
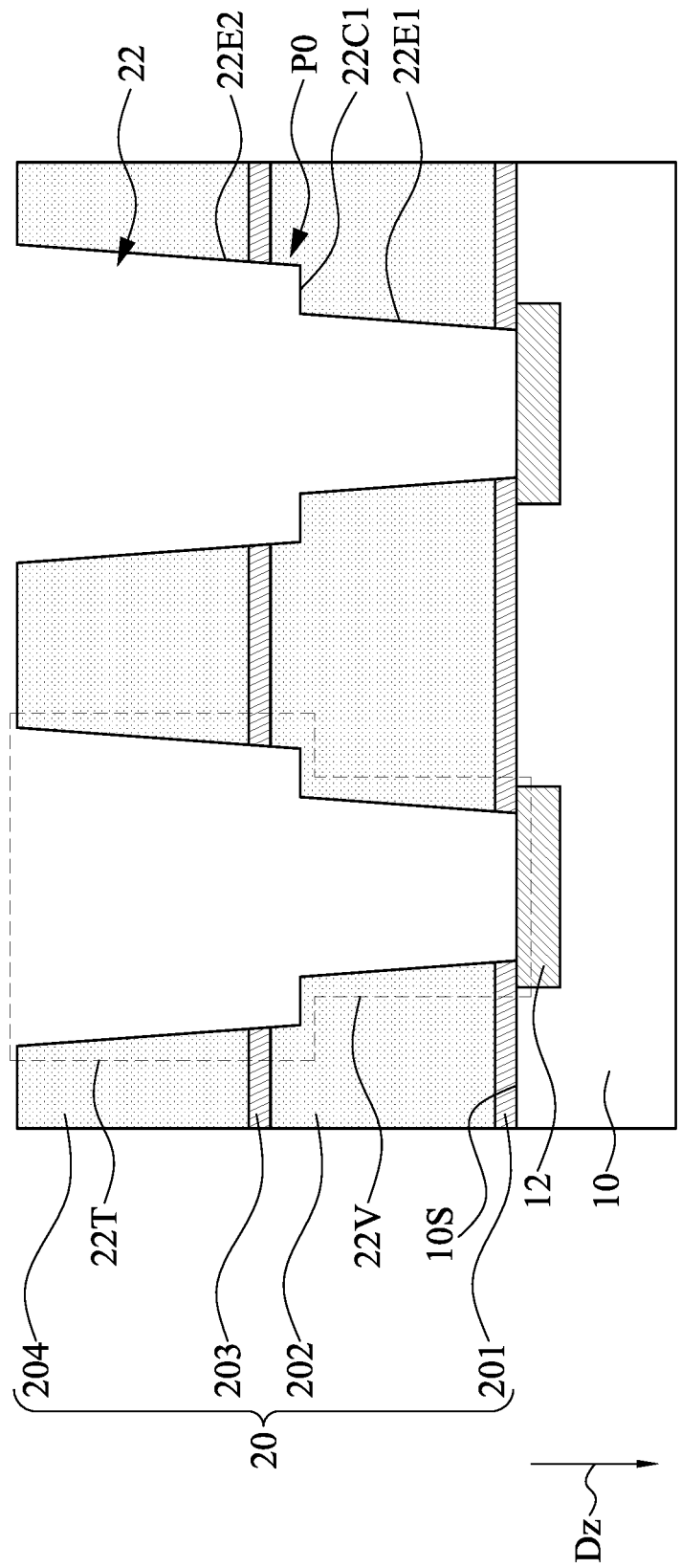

Referring to FIG. 2B, the at least one dielectric layer 20 is patterned, by e.g., etching to form a plurality of holes 22 exposing the first conductive layer 12. In some embodiments, the hole 22 may include a via portion 22V substantially disposed in the first etch stop layer 201 and the first dielectric layer 202, and a trench portion 22T disposed on and connected to the via portion 22V and substantially in the second etch stop layer 203 and the second dielectric layer 204. The trench portion 22T is wider than the via portion 22V, and the trench portion 22T and the via portion 22V collectively form a dual damascene shape with a step edge profile P0. The step edge profile P0 of the at least one dielectric layer 20 includes a first edge 22E1 (also referred to a first rise of step structure) extending substantially along a depth direction Dz of the at least one dielectric layer 20, a first connection edge 22C1 (also referred to a run of step structure) connected to and angled with the first edge 22E1, and a second edge 22E2 (also referred to a second rise of step structure) connected to the first connection edge 22C1 and extending substantially along the depth direction Dz. The first edge 22E1 and/or the second edge 22E2 may be substantially parallel to or inclined with respect to the depth direction Dz. In some embodiments, the holes 22 may be patterned by photolithography and etching techniques. By way of example, the dual damascene shape holes 22 may, but is not limited to, be patterned by via-first dual damascene process, trench-first dual damascene process or the like. The via portion 22V and the trench portion 22T may be formed by dry etching using fluorine containing precursors such as $CF_4$, $ChF_3$, $C_4F_8$ or a mixture thereof.

Figure 2C:
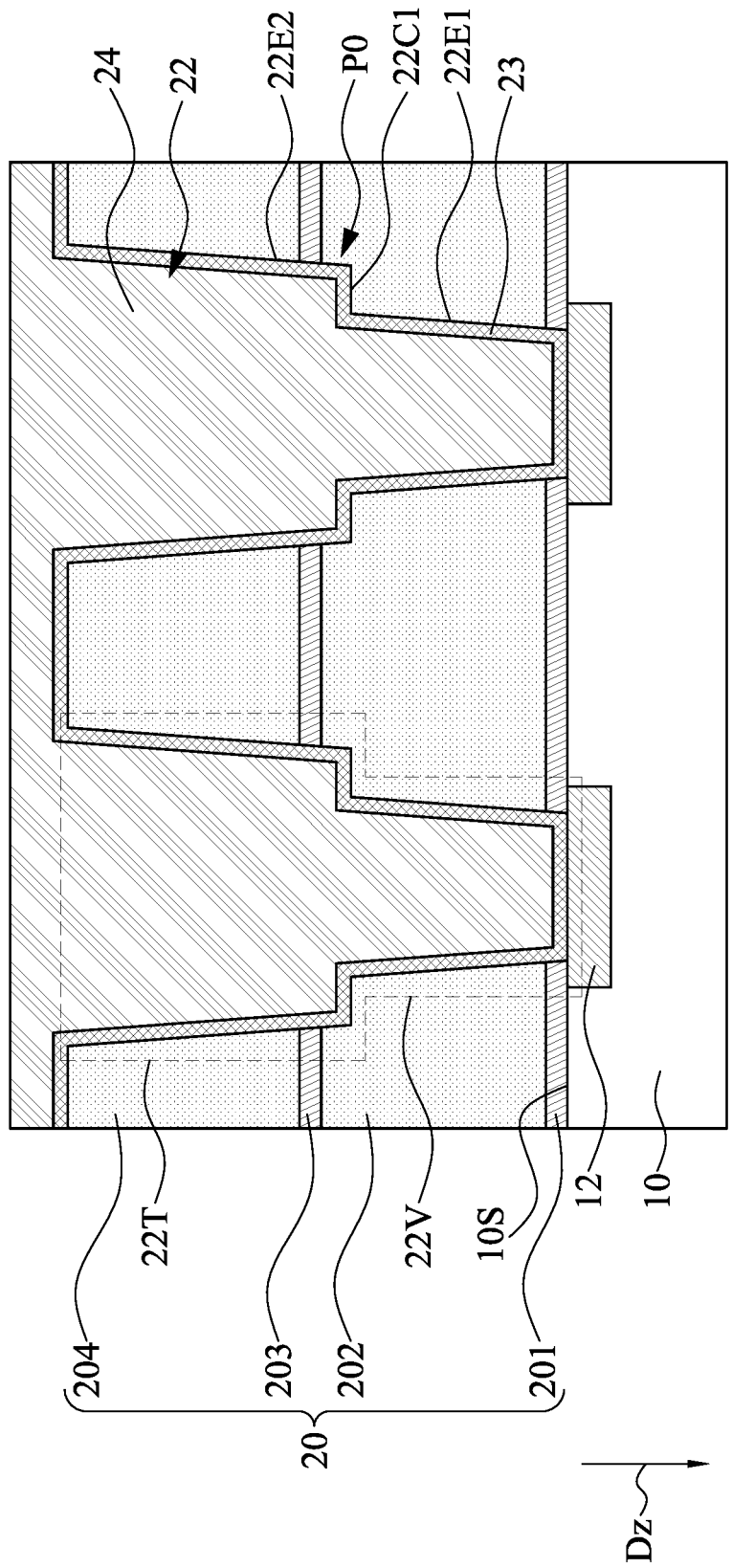

Referring to FIG. 2C, a sacrificial layer 24 is formed on the at least one dielectric layer 20 and filled in the holes 22. The material of the sacrificial layer 24 is distinct from the at least one dielectric layer 20 in etching rate such that the sacrificial layer 24 can be removed easily from the at least one dielectric layer 20. By way of example, the sacrificial layer 24 may include a conductive layer such as a copper layer. In some embodiments, a barrier layer 23 may be optionally formed on the at least one dielectric layer 20 and filled in the holes 22 prior to formation of the sacrificial layer 24. The barrier layer 23 may be substantially conformal with respect to profile of the hole 22. In some embodiments, the barrier layer 23 may include a tantalum/tantalum nitride (Ta/TaN) layer or the like. The barrier layer 23 may be configured to mitigate diffusion of the material of the sacrificial layer 24.

Figure 2D:
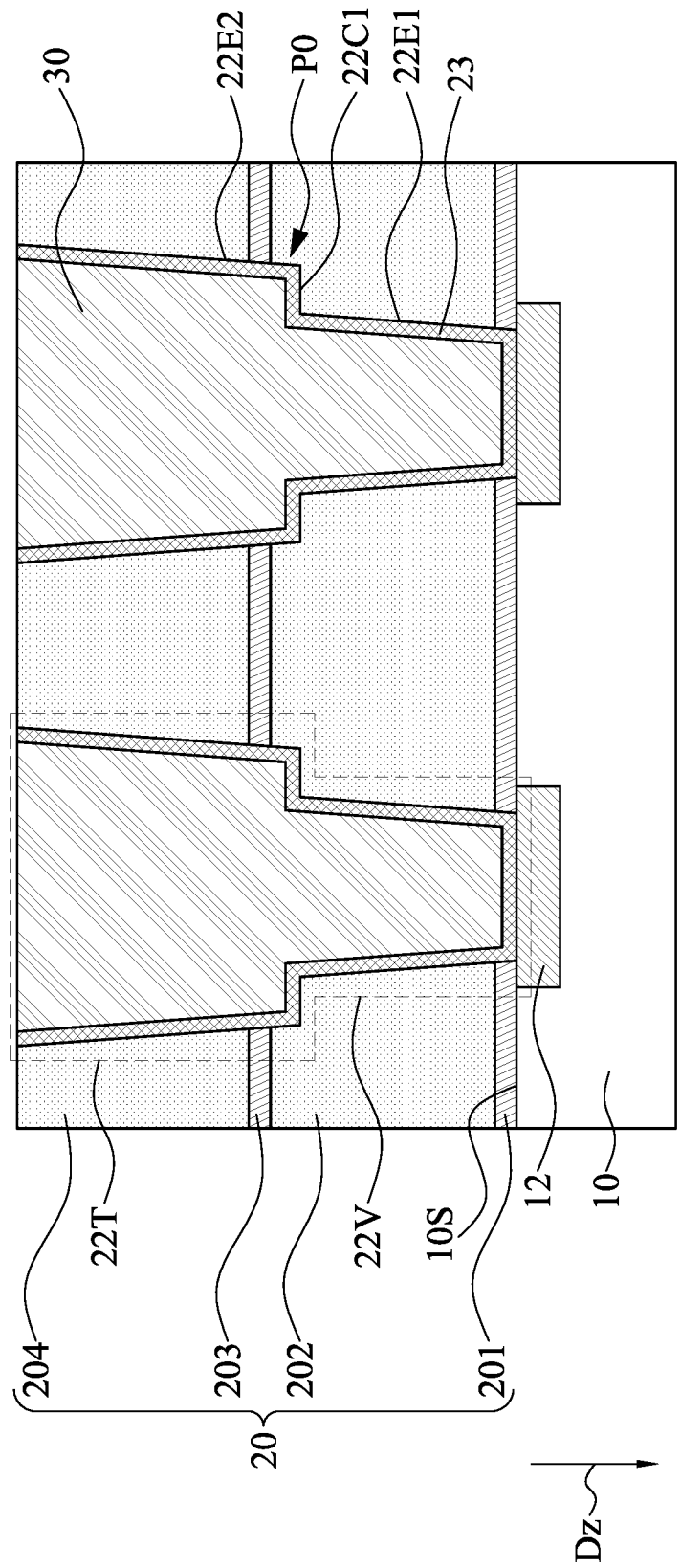

Referring to FIG. 2D, the sacrificial layer 24 and the barrier layer 23 outside the holes 22 are removed to form sacrificial dual damascene conductive structures 30 in the holes 22 with the barrier layer 23 remaining in the holes 22. In some embodiments, the sacrificial layer 24 and the barrier layer 23 outside the holes 22 are removed by a planarization operation such as a chemical mechanical polish (CMP) operation.

Figure 2E:
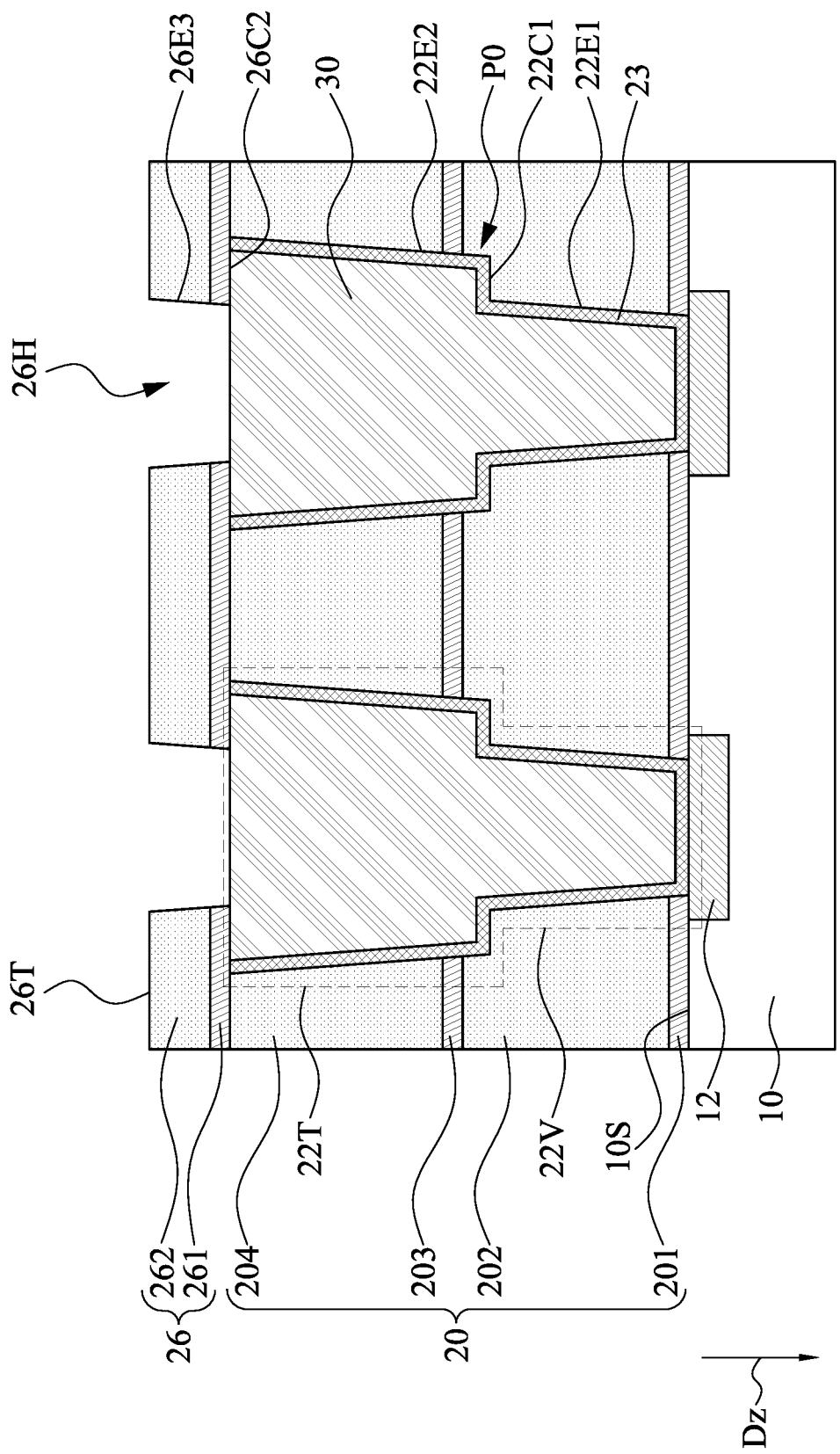

Referring to FIG. 2E, a cap barrier layer 26 is formed on the at least one dielectric layer 20 to cover the sacrificial dual damascene conductive structures 30. In some embodiments, the cap barrier layer 26 may be a composite layer including a first cap barrier layer 261 and a second cap barrier layer 262 stacked on the first cap barrier layer 261. The material of the composite layer may include dielectric material such as silicon oxide, silicon nitride, silicon carbide and silicon oxynitride, and semiconductive material such as polycrystalline silicon. For example, the first cap barrier layer 261 may include silicon carbide, and the second cap barrier layer 262 may include silicon oxide.

The cap barrier layer 26 is then patterned to form openings 26H exposing the sacrificial dual damascene conductive structures 30 in the holes 22. In some embodiments, the dimension of the opening 26H is smaller than the dimension of the sacrificial dual damascene conductive structures 30 such that the opening 26H only partially exposes the sacrificial dual damascene conductive structures 30. In some embodiments, the cap barrier layer 26 includes a second connection edge 26C2 connected to and angled with the second edge 22E2, and a third edge 26E3 connected to the second connection edge 26C2 and extending substantially along the depth direction Dz. The third edge 26E3 may be substantially parallel to or inclined with respect to the depth direction Dz.

Figure 2F:
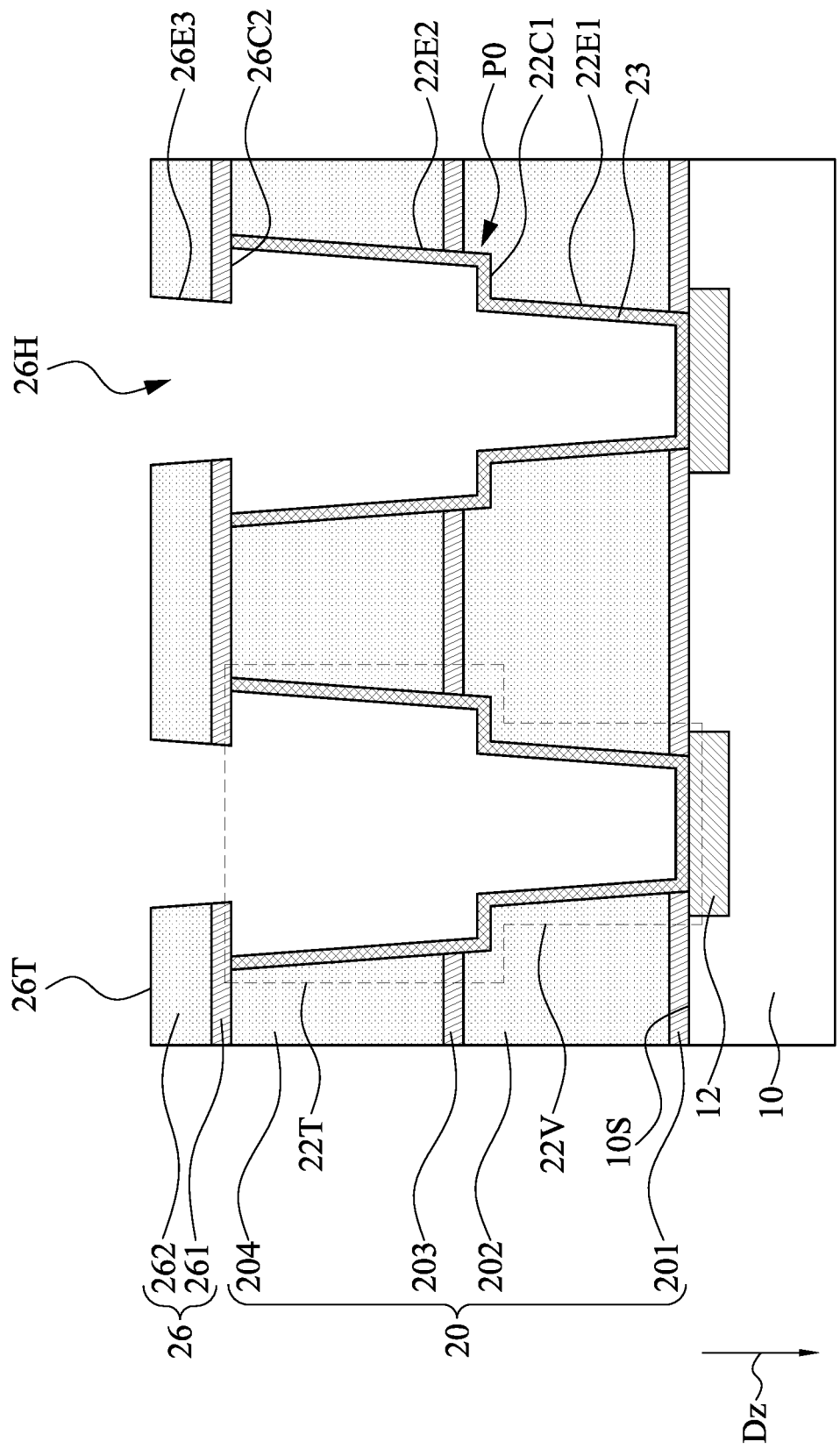

Referring to FIG. 2F, the sacrificial dual damascene conductive structures 30 in the holes 22 exposed from the opening 26H of the cap barrier layer 26 are removed. In some embodiments, the sacrificial dual damascene conductive structures 30 are removed by isotropic etching such as a wet etching operation. The isotropic etching may help to laterally etch the sacrificial dual damascene conductive structures 30 in the holes 22. By way of example, the sacrificial dual damascene conductive structures 30 may include copper, and can be etched by an etchant. The etchant may include ammonia-hydrogen peroxide-water mixture (APM), sulfuric acid-hydrogen peroxide-water mixture (SPM), hydrochloric acid-hydrogen peroxide-water mixture (HPM), hydrogen fluoride (HF) or a mixture thereof. In some embodiments, the barrier layer 23 may, but is not limited to, be left in the holes 22 after the sacrificial dual damascene conductive structures 30 are removed.

Figure 2G:
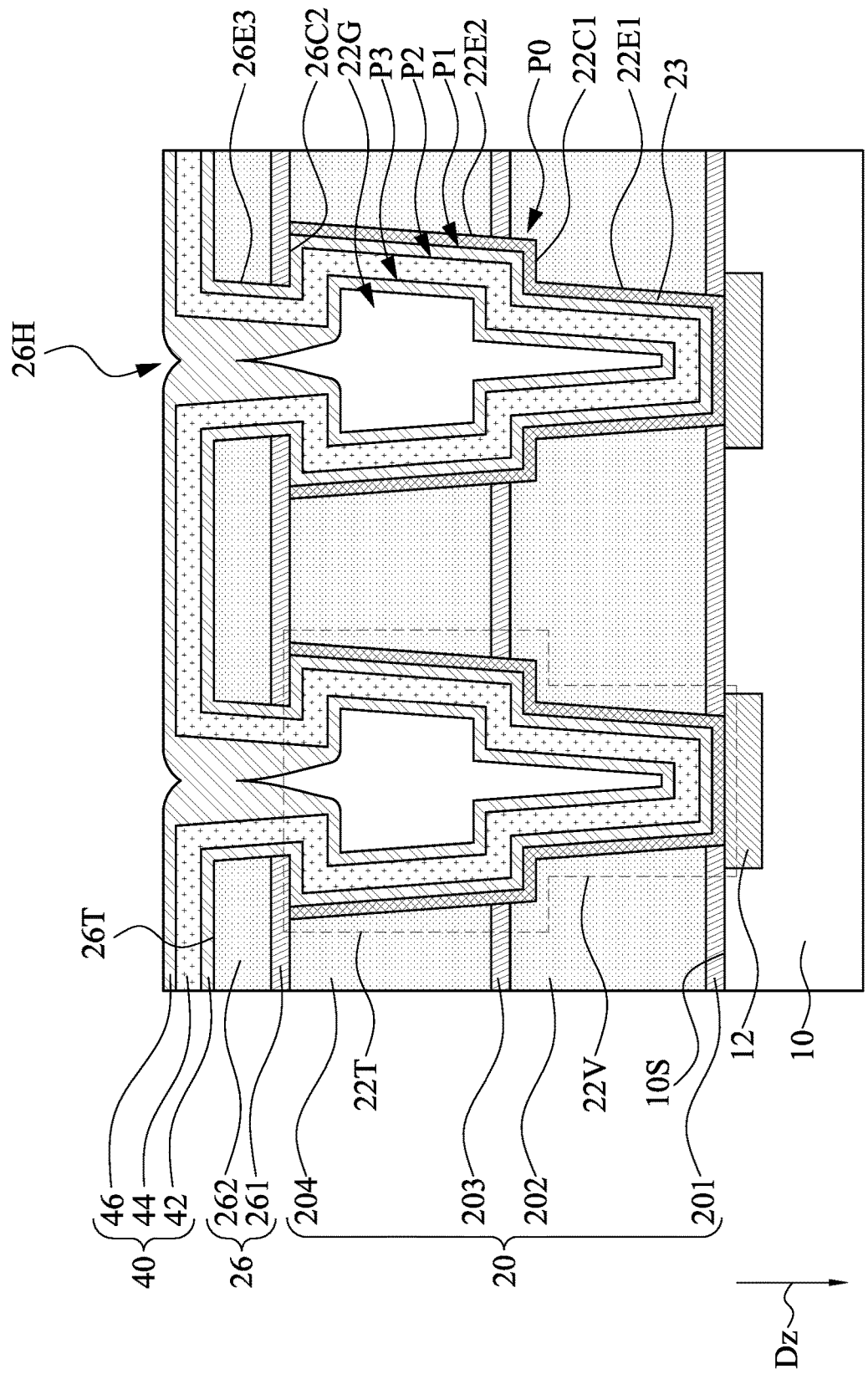

Referring to FIG. 2G, a plurality of capacitor structures 40 are formed in the holes 22. In some embodiments, the capacitor structures 40 may include an MIM capacitor structure and may be formed by the following operations. A bottom electrode 42 is formed in the holes 22. In some embodiments, the bottom electrode 42 may include a conductive layer such as a metal layer or a metal compound layer. By way of example, the bottom electrode 42 may include a titanium layer, a titanium nitride layer, a tantalum layer, a tantalum nitride layer, a stack of above layers, or other metal or conductive layers. In some embodiments, the bottom electrode 42 is conformally formed on a bottom and an edge of the hole 22, thereby having a first step profile P1 substantially conformal to the step edge profile P0 of the at least one dielectric layer 20. By way of example, the bottom electrode 42 may be formed by atomic layer deposition (ALD) operation or other suitable manufacturing operations.

A capacitor dielectric layer 44 is then formed on the bottom electrode 42. The material of the capacitor dielectric layer 44 may be selected based on capacitance requirement. In some embodiments, the capacitor dielectric layer 44 may include silicon oxide, silicon nitride, hafnium oxide, aluminum oxide, zirconium oxide or other suitable high-k or low-k dielectric material. In some embodiments, the thickness of the bottom electrode 42 may, but is not limited to, be ranging from about 50 angstroms to about 1000 angstroms. In some embodiments, the capacitor dielectric layer 44 is conformally formed on the bottom and the edge of the hole 22, thereby having a second step profile P2 substantially conformal to the first step profile P1. By way of example, the capacitor dielectric layer 44 may be formed by ALD operation or other suitable manufacturing operations. In some embodiments, the thickness of the capacitor dielectric layer 44 may, but is not limited to, be ranging from about 20 angstroms to about 100 angstroms.

A top electrode 46 is subsequently formed on the capacitor dielectric layer 44. The material and/or thickness of the top electrode 46 may, but is not limited to, be similar to that of the bottom electrode 42. In some embodiments, the top electrode 46 is conformally formed on the bottom and the edge of the hole 22, thereby having a third step profile P3 substantially conformal to the second step profile P2. By way of example, the top electrode 46 may be formed by ALD operation or other suitable manufacturing operations. ALD operation helps to uniformly form the bottom electrode 42, the capacitor dielectric layer 44 and the top electrode 46 along sidewalls and bottom surfaces in the holes 22.

In some embodiments, the hole 22 may be sealed by the top electrode 46, and an air gap 22G may be formed in the hole 22. In some embodiments, the top electrode 46 may spontaneously seal the hole 22 due to the smaller dimension of the opening 26H of the cap barrier layer 26, thereby forming an air gap 22G in the hole 22 as shown in FIG. 2G. The bottom electrode 42, the capacitor dielectric layer 44 and the top electrode 46 may be patterned by photolithography and etching technique to form a plurality of capacitor structures 40. In some embodiments, the bottom electrode 42, the capacitor dielectric layer 44 and the top electrode 46 may be patterned by the same photolithography and etching operation. In some embodiments, the bottom electrode 42, the capacitor dielectric layer 44 and the top electrode 46 further extend to cover a top surface 26T of the cap barrier layer 26.

Figure 2H:
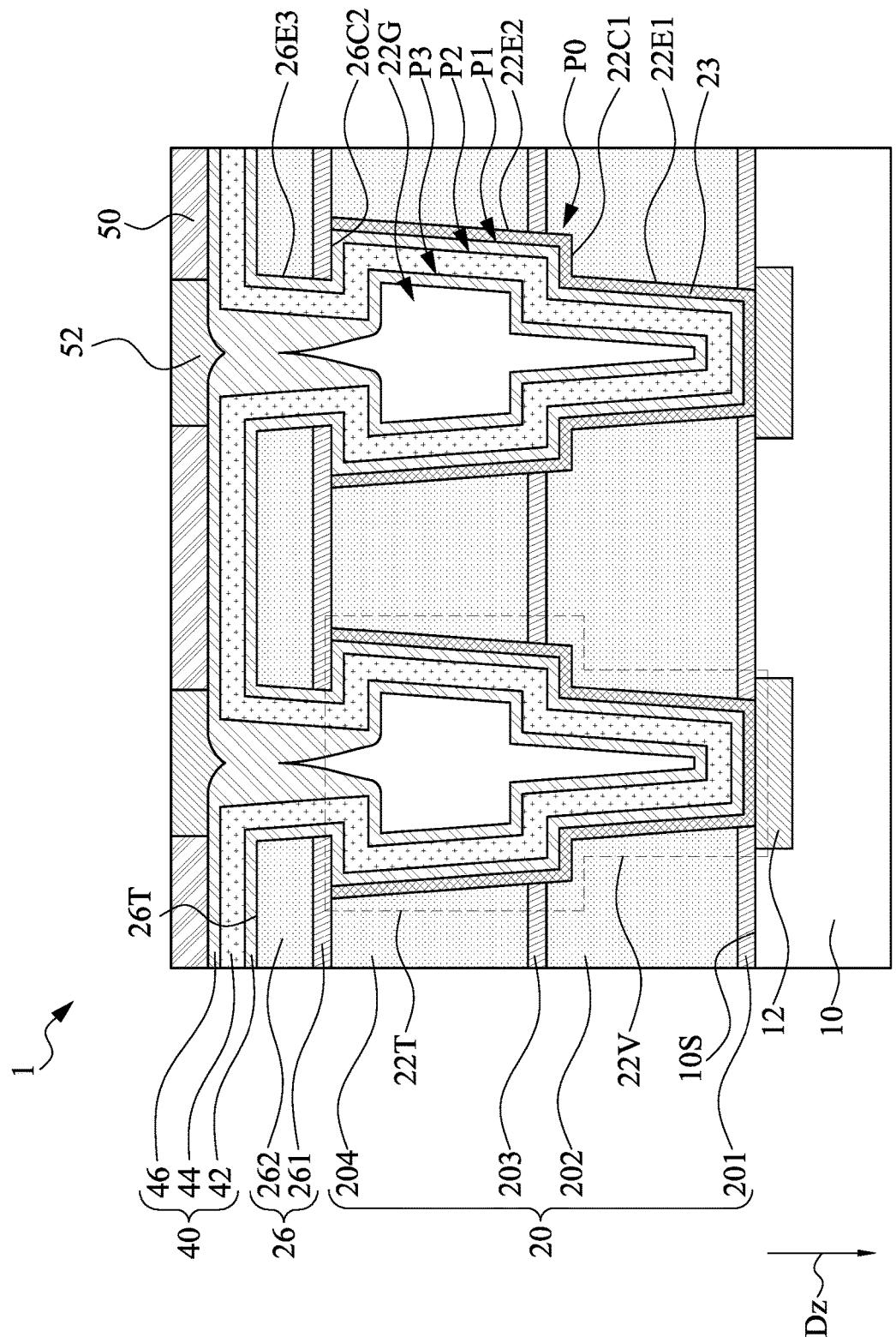

Referring to FIG. 2H, a passivation layer 50 may be formed on the cap barrier layer 26 and exposing the top electrode 46 of the capacitor structure 40. A second conductive layer 52 may be formed on and electrically connected to the top electrode 46 of the capacitor structure 40 to form a semiconductor structure 1 of some embodiments of the present disclosure. In some embodiments, the second conductive layer 52 may be configured as an electrical contact such as a top via to electrically connect the capacitor structure 40 to an electronic component such as an optical sensor (e.g., CIS sensor). The capacitance provided by the capacitor structure 40 can increase full well capacity (MC) of the optical sensor, and thus can improve the contrast of darkness/brightness (i.e., dynamic range).

Figure 3:
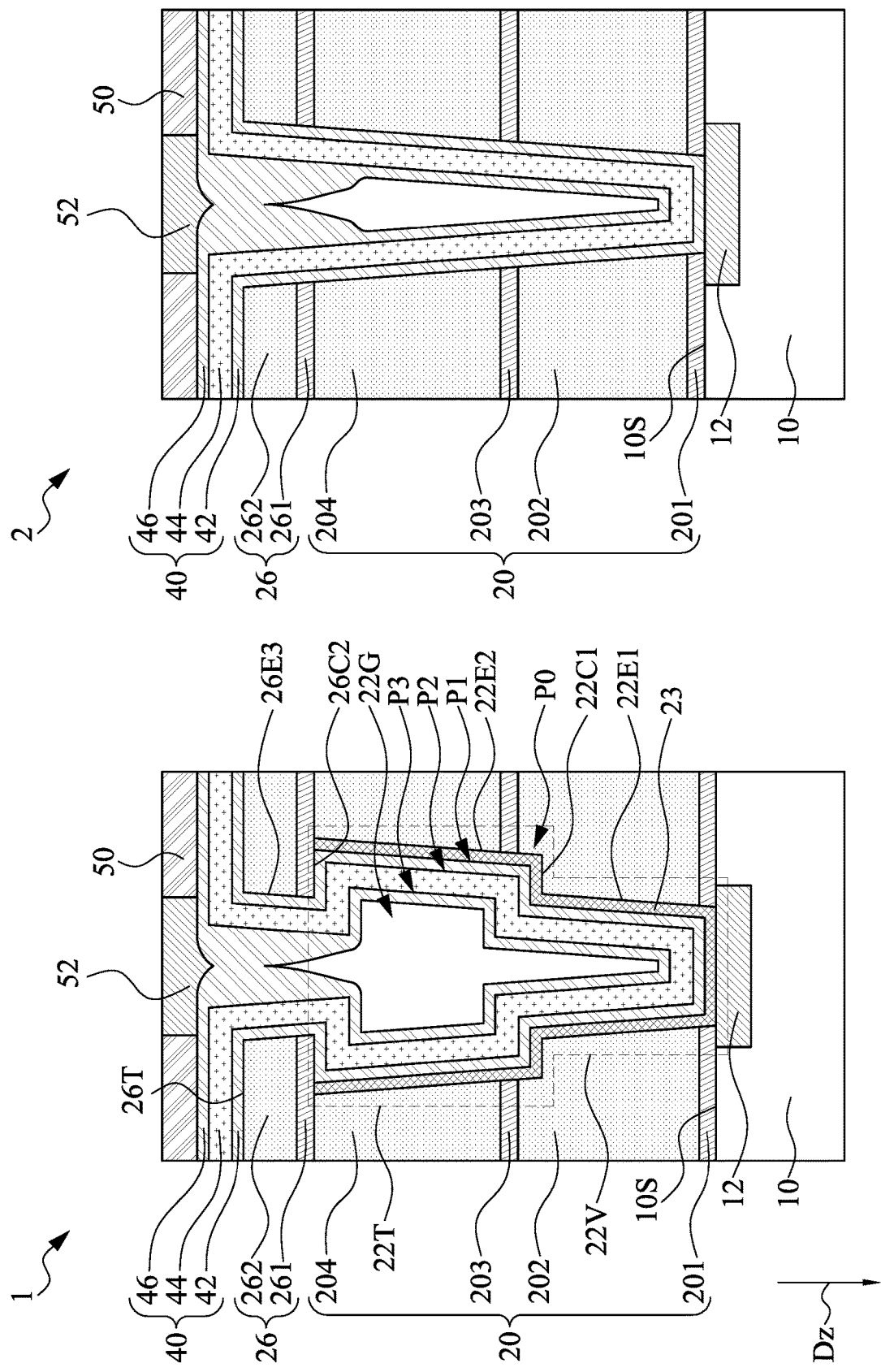
FIG. 3 is a schematic diagram illustrating two semiconductor structures in accordance with some embodiments of the present disclosure.

FIG. 3 is a schematic diagram illustrating two semiconductor structures in accordance with some embodiments of the present disclosure, FIG. 3A is a simplified schematic diagram of a semiconductor structure in left portion FIG. 3, and FIG. 3B is a simplified schematic diagram of a semiconductor structure in right portion FIG. 3. Referring to FIG. 3, a semiconductor structure 1 as illustrated in FIG. 2H is shown in the left half, and another semiconductor structure 2 of some capacitive embodiments is shown in the right half. In contrast to the semiconductor structure 2, a portion of the capacitor structure 40 protrudes outwardly, and thus extra capacitance can be generated. As shown in FIG. 3B, the semiconductor structure 2 includes a length L, a width W and a depth D. The overall area of the capacitor structure of the semiconductor structure 2 is equal to 2*(L*W+W*D+L*D). On the other hand, the two protrusions of the capacitor structure 40 each include a length L, a width 1.1W and a depth 0.5D. Accordingly, an extra area of the capacitor structure of the semiconductor structure 1 is equal to 4(1.1W*0.5D+1.1W*L) as shown in FIG. 3A.

Figure 4A:
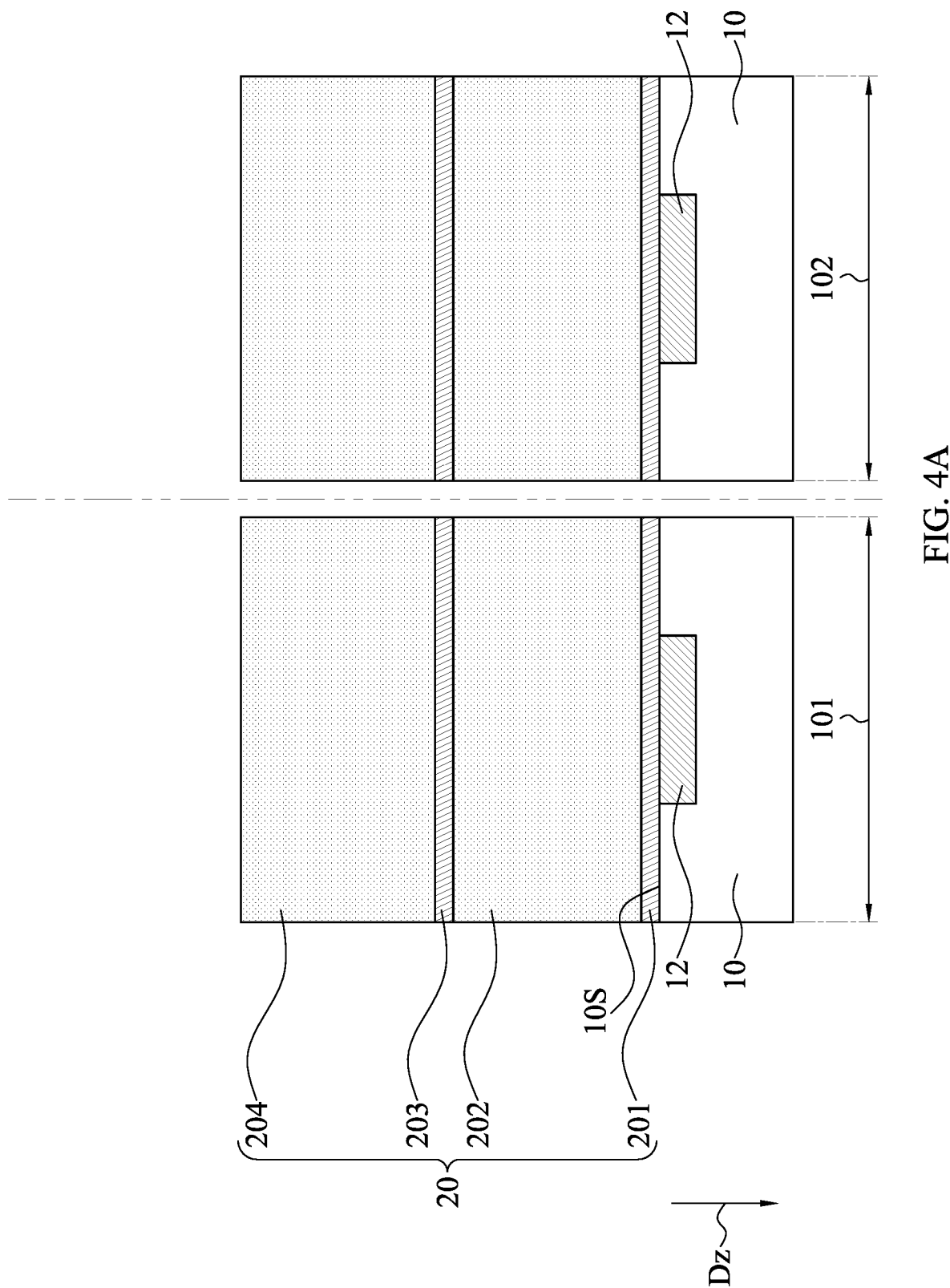
FIG. 4A, FIG. 4B, FIG. 4C, FIG. 4D, FIG. 4E, FIG. 4F, FIG. 4G and FIG. 4H are schematic views at one of various operations of manufacturing a semiconductor structure according to one or more embodiments of the present disclosure.

FIG. 4A, FIG. 4B, FIG. 4C, FIG. 4D, FIG. 4E, FIG. 4F, FIG. 4G and FIG. 4H are schematic views at one of various operations of manufacturing a semiconductor structure according to one or more embodiments of the present disclosure. Referring to FIG. 4A, a substrate 10 is received. The substrate 10 may, but is not limited to, a semiconductor substrate. The substrate 10 includes a surface 10S (e.g., an active surface) on which electronic and/or semiconductor devices such as active devices, passive devices or the like are formed. In some embodiments, driving devices such as metal-oxide semiconductor (MOS) transistors (not shown) may be formed adjacent to the surface 10S of the substrate 10. In some embodiments, the substrate 10 may include a first region 101 and a second region 102 configured to form semiconductor structures with different functionalities and/or purposes. By way of example, the first region 101 may include an interconnection region, a non-capacitor region or the like, and the second region 102 may include a capacitor region.

In some embodiments, an interconnection layer (not shown) including one or more conductive layers and one or more inter-dielectric layers may be formed over the substrate 10, and electrically connected to the driving devices. By way of example, a first conductive layer 12 such as a copper layer of the interconnection layer is shown in FIG. 4A. The first conductive layer 12 may be configured as electrical contacts. For example, the first conductive layer 12 in the first region 101 may be used as a bottom via to electrically connect a dual damascene conductive structure to be formed to the driving device, while the first conductive layer 12 in the second region 102 may be used as a bottom via to electrically connect a capacitor structure to be formed to the driving device.

Subsequently, at least one dielectric layer 20 is formed over the substrate 10. In some embodiments, the at least one dielectric layer 20 may be parts of the interconnection layer, and covers the first conductive layer 12. By way of example, the at least one dielectric layer 20 may be a composite layer including a first etch stop layer 201, a first dielectric layer 202, a second etch stop layer 203 and a second dielectric layer 204 stacked on the substrate 10. The material of the composite layer may include dielectric material such as silicon oxide, silicon nitride, silicon carbide and silicon oxynitride, and semiconductive material such as polycrystalline silicon. For example, the first etch stop layer 201 and the second etch stop layer 203 may include silicon nitride, and the first dielectric layer 202 and the second dielectric layer 204 may include silicon oxide.

Figure 4B:
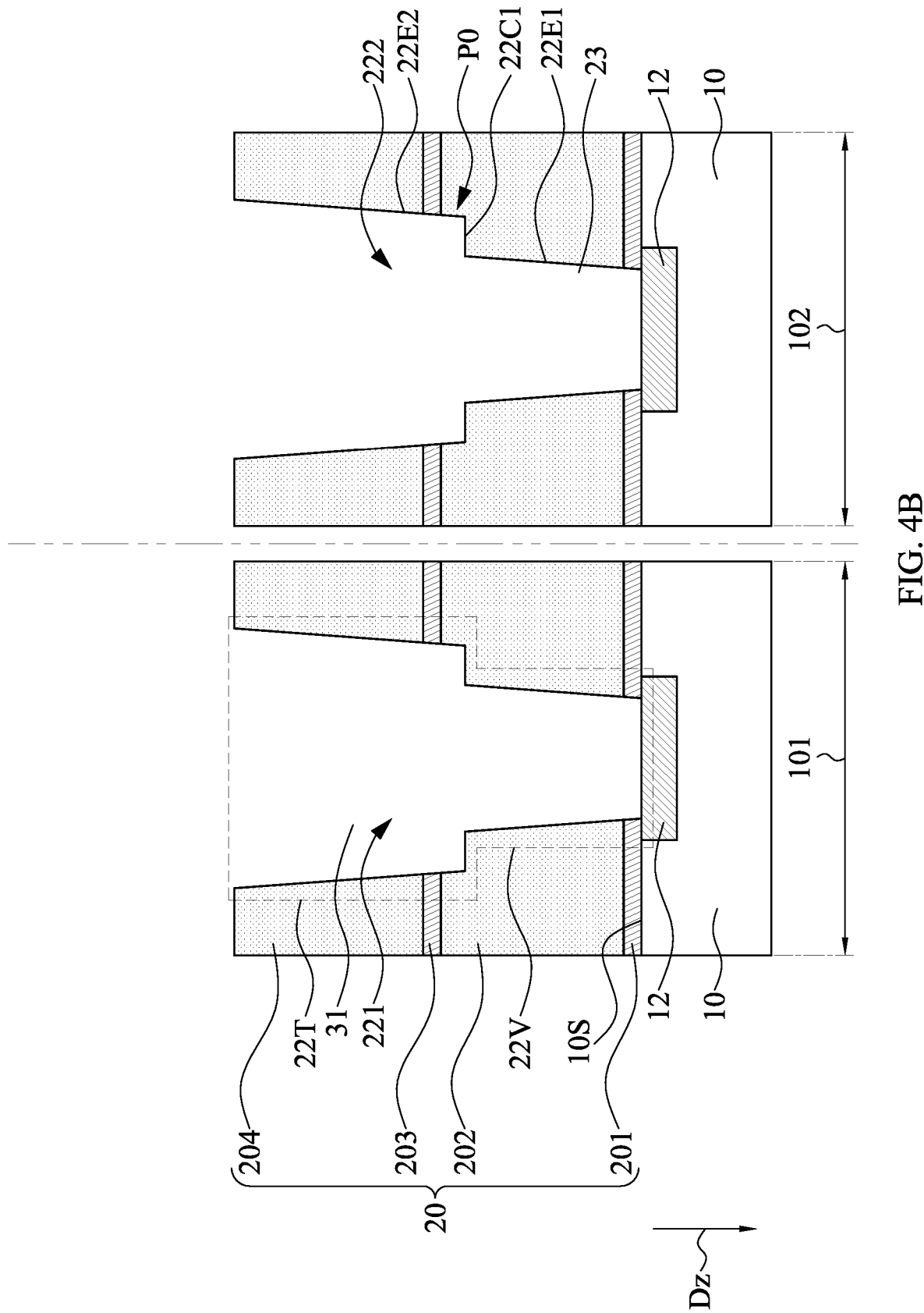

Referring to FIG. 4B, the at least one dielectric layer 20 is patterned, by e.g., etching to form a first hole 221 and a second hole 222 exposing the first conductive layer 12. In some embodiments, the first hole 221 and the second hole 222 have the same shape, and each may include a via portion 22V substantially disposed in the first etch stop layer 201 and the first dielectric layer 202, and a trench portion 22T disposed on and connected to the via portion 22V and substantially in the second etch stop layer 203 and the second dielectric layer 204. The trench portion 22T is wider than the via portion 22V, and the trench portion 22T and the via portion 22V collectively form a dual damascene shape with a step edge profile P0. The step edge profile P0 of the at least one dielectric layer 20 includes a first edge 22E1 extending substantially along a depth direction Dz of the at least one dielectric layer 20, a first connection edge 22C1 connected to and angled with the first edge 22E1, and a second edge 22E2 connected to the first connection edge 22C1 and extending substantially along the depth direction Dz. The first edge 22E1 and/or the second edge 22E2 may be substantially parallel to or inclined with respect to the depth direction Dz. In some embodiments, the first hole 221 and the second hole 222 may be patterned by photolithography and etching techniques. By way of example, the dual damascene shape first hole 221 and second hole 222 may, but is not limited to, be patterned by via-first dual damascene process, trench-first dual damascene process or the like. The via portion 22V and the trench portion 22T may be formed by dry etching using fluorine containing precursors such as $CF_4$, $ChF_3$, $C_4F_8$ or a mixture thereof.

Figure 4C:
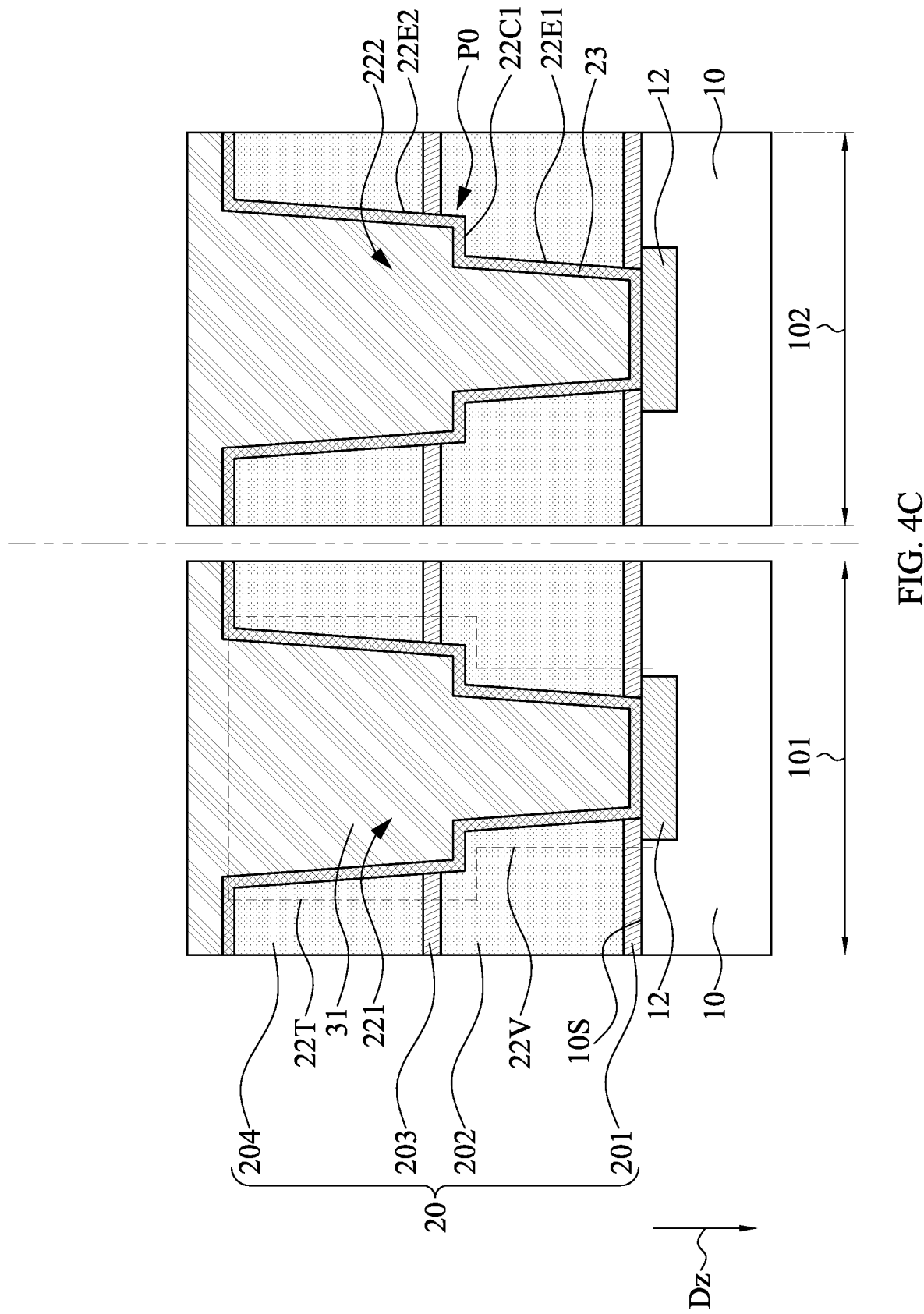

Referring to FIG. 4C, a conductive layer 25 is formed on the at least one dielectric layer 20 and filled in first hole 221 and the second hole 222. The material of the conductive layer 25 is distinct from the at least one dielectric layer 20 in etching rate such that the conductive layer 25 can be removed easily from the at least one dielectric layer 20. By way of example, the conductive layer 25 may include a metal layer such as a copper layer. In some embodiments, a barrier layer 23 may be optionally formed on the at least one dielectric layer 20 and filled in first hole 221 and the second hole 222 prior to formation of the conductive layer 25. The barrier layer 23 may be substantially conformal with respect to profile of first hole 221 and the second hole 222. In some embodiments, the barrier layer 23 may include a tantalum/tantalum nitride (Ta/TaN) layer or the like. The barrier layer 23 may be configured to mitigate diffusion of the material of the conductive layer 25. In some embodiments, the barrier layer 23 in the first hole 221 (also referred to as a first barrier layer) and the barrier layer 23 in the second hole 222 (also referred to as a second barrier layer) may include the same shape and dimension.

Figure 4D:
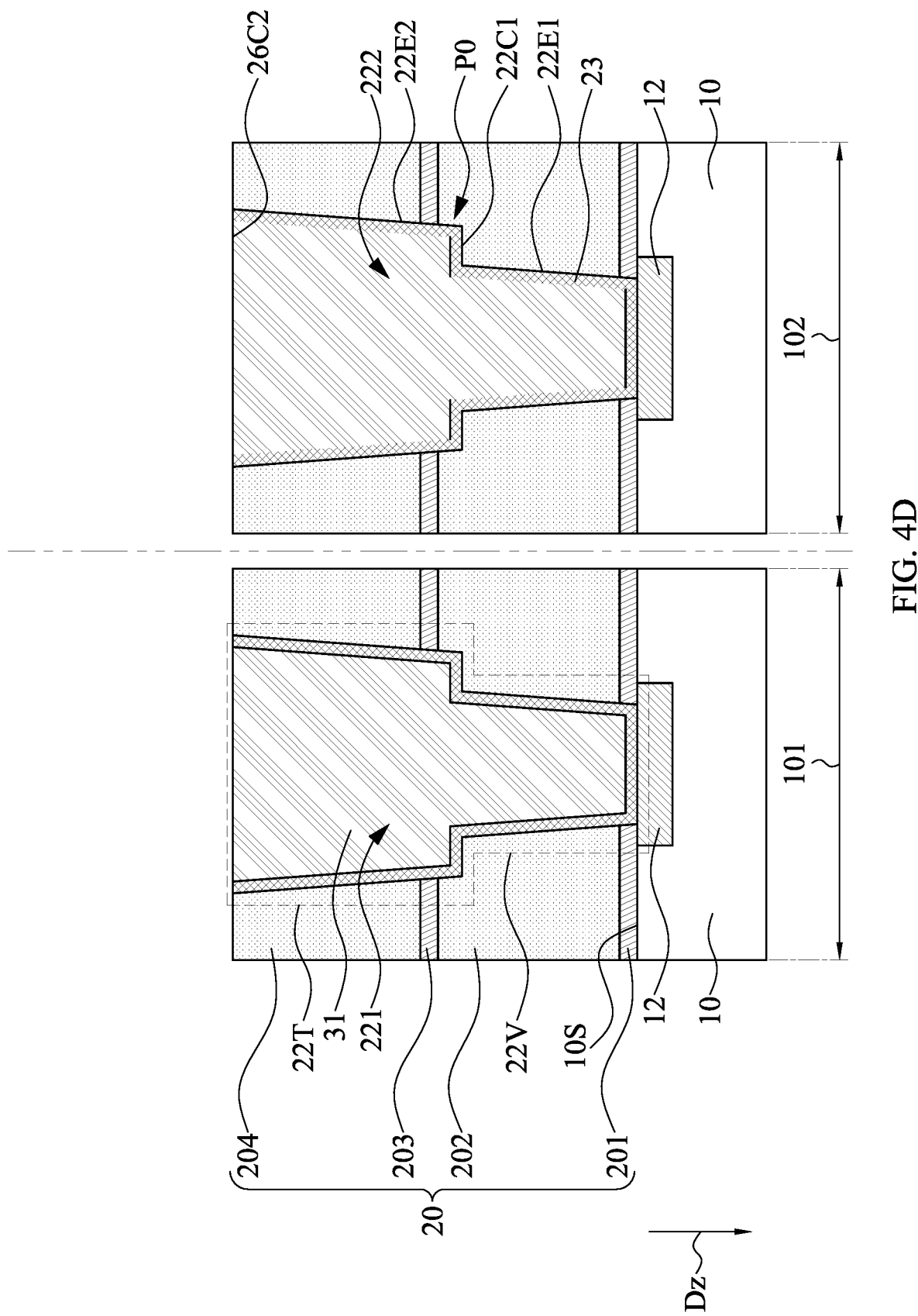

Referring to FIG. 4D, the conductive layer 25 and the barrier layer 23 outside the first hole 221 and the second hole 222 are removed to form a plurality of dual damascene conductive structures 31 in the first hole 221 and the second hole 222 with the barrier layer 23 remaining in the first hole 221 and the second hole 222. In some embodiments, the conductive layer 25 and the barrier layer 23 outside the first hole 221 and the second hole 222 are removed by a planarization operation such as a chemical mechanical polish (CMP) operation.

Figure 4E:
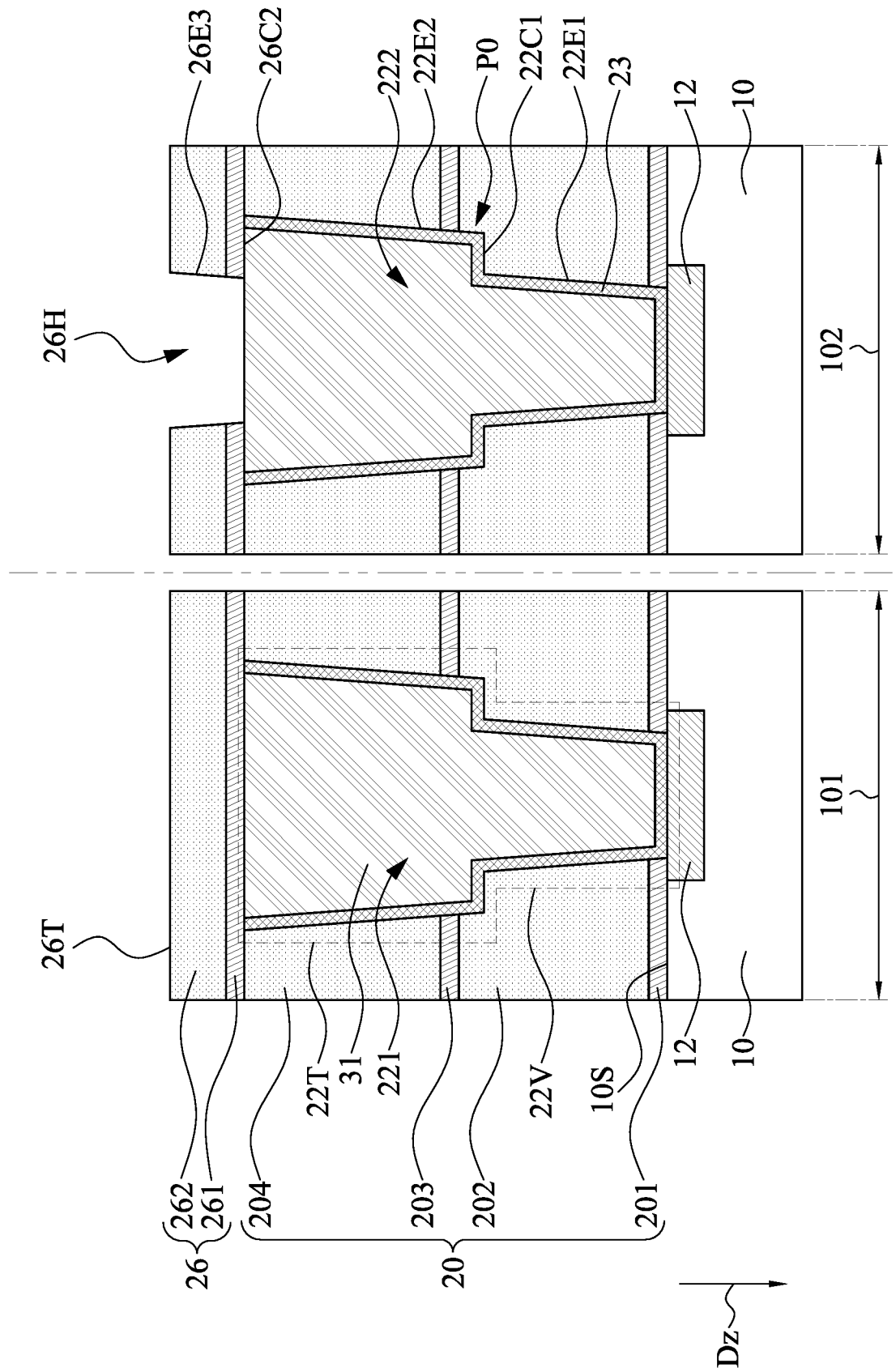

Referring to FIG. 4E, a cap barrier layer 26 is formed on the at least one dielectric layer 20 to cover the dual damascene conductive structures 31. In some embodiments, the cap barrier layer 26 may be a composite layer including a first cap barrier layer 261 and a second cap barrier layer 262 stacked on the first cap barrier layer 261. The material of the composite layer may include dielectric material such as silicon oxide, silicon nitride, silicon carbide and silicon oxynitride, and semiconductive material such as polycrystalline silicon. For example, the first cap barrier layer 261 may include silicon carbide, and the second cap barrier layer 262 may include silicon oxide.

The cap barrier layer 26 is then patterned to form an opening 26H exposing the dual damascene conductive structures 30 in the second hole 222, while the dual damascene conductive structure 31 in the first hole 221 is covered by the cap barrier layer 26. In some embodiments, the dimension of the opening 26H is smaller than the dimension of the dual damascene conductive structure 31 in the second hole 222 such that the opening 26H only partially exposes the dual damascene conductive structure 31 in the second hole 222. In some embodiments, the cap barrier layer 26 includes a second connection edge 26C2 connected to and angled with the second edge 22E2, and a third edge 26E3 connected to the second connection edge 26C2 and extending substantially along the depth direction Dz. The third edge 26E3 may be substantially parallel to or inclined with respect to the depth direction Dz.

Figure 4F:
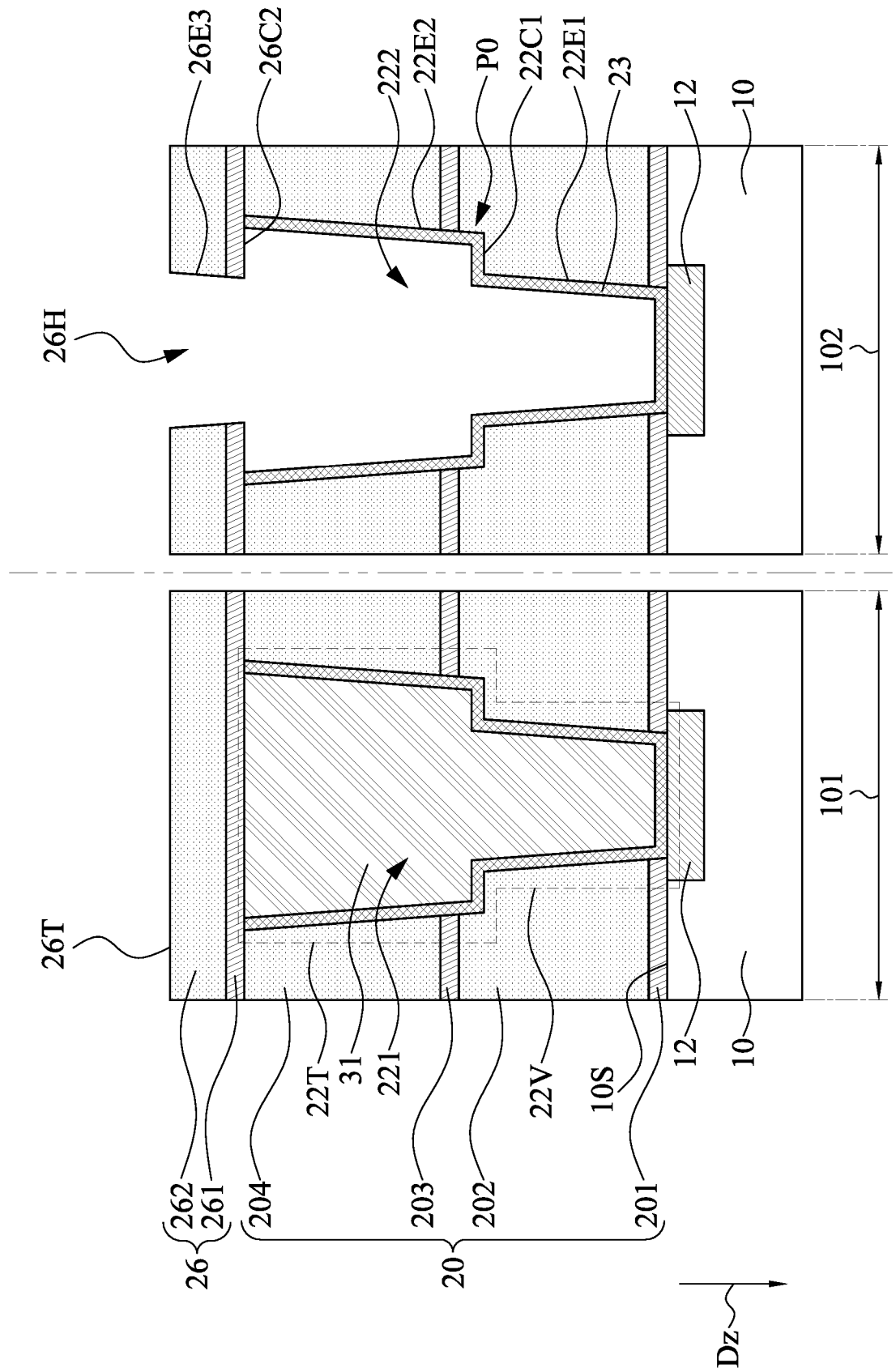

Referring to FIG. 4F, the dual damascene conductive structure 31 in the second hole 222 exposed from the opening 26H of the cap barrier layer 26 is removed, while the dual damascene conductive structure 31 in the first hole 221 is covered by the cap barrier layer 26 and preserved. In some embodiments, the dual damascene conductive structure 31 is removed by isotropic etching such as a wet etching operation. The isotropic etching may help to laterally etch the dual damascene conductive structure 31 in the second hole 222. By way of example, the dual damascene conductive structure 31 may include copper, and can be etched by an etchant. The etchant may include ammonia-hydrogen peroxide-water mixture (APM), sulfuric acid-hydrogen peroxide-water mixture (SPM), hydrochloric acid-hydrogen peroxide-water mixture (HPM), hydrogen fluoride (HF) or a mixture thereof. In some embodiments, the barrier layer 23 may, but is not limited to, be left in the second hole 222 after the dual damascene conductive structure 31 is removed.

Figure 4G:
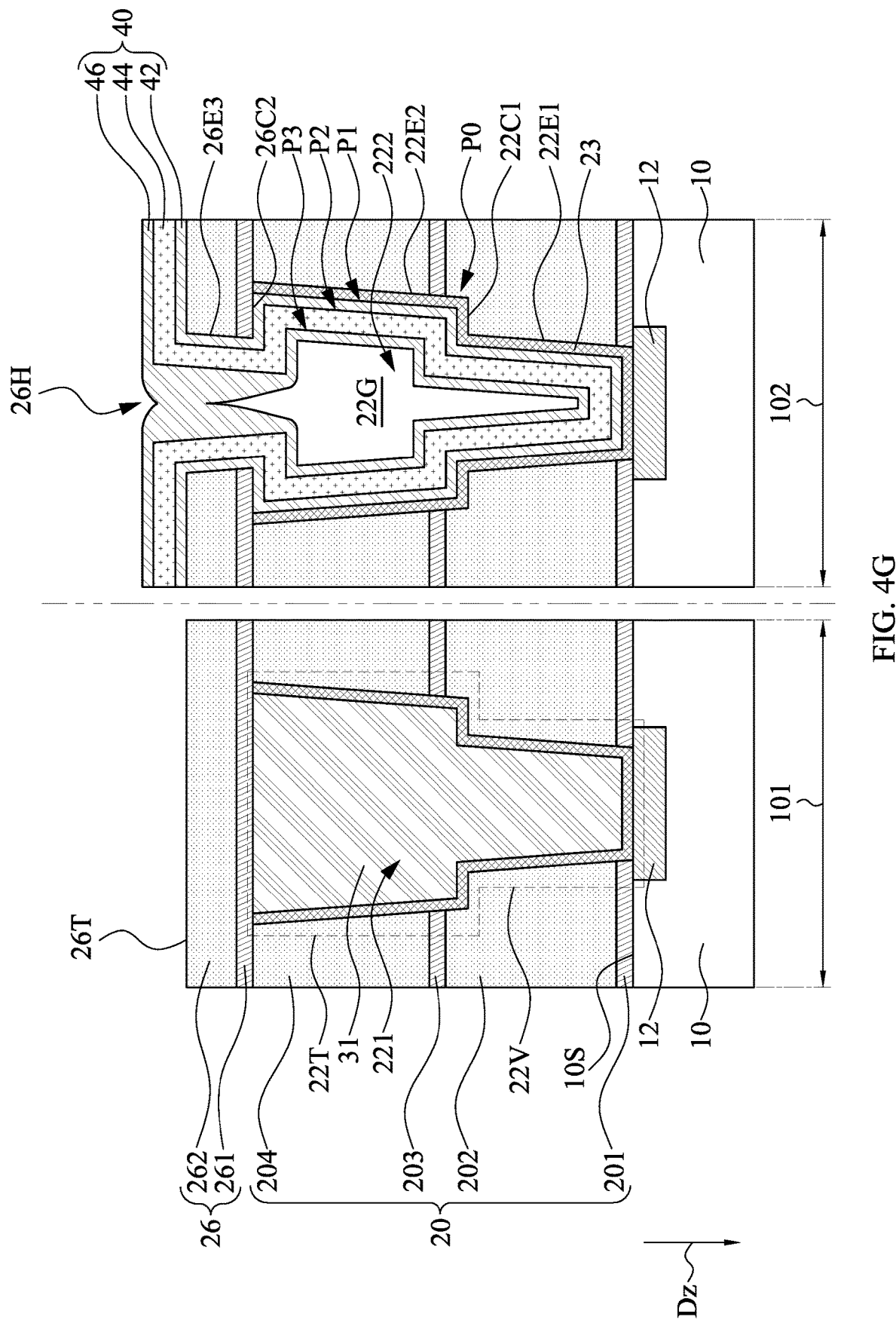

Referring to FIG. 4G, a capacitor structure 40 is formed in the second hole 222. In some embodiments, the capacitor structure 40 may include an MNI capacitor structure and may be formed by the following operations. A bottom electrode 42 is formed in the second hole 222. In some embodiments, the bottom electrode 42 may include a conductive layer such as a metal layer or a metal compound layer. By way of example, the bottom electrode 42 may include a titanium layer, a titanium nitride layer, a tantalum layer, a tantalum nitride layer, a stack of above layers, or other metal or conductive layers. In some embodiments, the bottom electrode 42 is conformally formed on a bottom and an edge of the second hole 222, thereby having a first step profile P1 substantially conformal to the step edge profile P0 of the at least one dielectric layer 20. By way of example, the bottom electrode 42 may be formed by atomic layer deposition (ALD) operation or other suitable manufacturing operations.

A capacitor dielectric layer 44 is then formed on the bottom electrode 42. The material of the capacitor dielectric layer 44 may be selected based on capacitance requirement. In some embodiments, the capacitor dielectric layer 44 may include silicon oxide, silicon nitride, hafnium oxide, aluminum oxide, zirconium oxide or other suitable high-k or low-k dielectric material. In some embodiments, the thickness of the bottom electrode 42 may, but is not limited to, be ranging from about 50 angstroms to about 1000 angstroms. In some embodiments, the capacitor dielectric layer 44 is conformally formed on the bottom and the edge of the second hole 222, thereby having a second step profile P2 substantially conformal to the first step profile P1. By way of example, the capacitor dielectric layer 44 may be formed by ALD operation or other suitable manufacturing operations. In some embodiments, the thickness of the capacitor dielectric layer 44 may, but is not limited to, be ranging from about 20 angstroms to about 100 angstroms.

A top electrode 46 is subsequently formed on the capacitor dielectric layer 44. The material and/or thickness of the top electrode 46 may, but is not limited to, be similar to that of the bottom electrode 42. In some embodiments, the top electrode 46 is conformally formed on the bottom and the edge of the second hole 222, thereby having a third step profile P3 substantially conformal to the second step profile P2. By way of example, the top electrode 46 may be formed by ALD operation or other suitable manufacturing operations. Because the first hole 221 and the second hole 222 are formed simultaneously and may have substantially the same shape, the edge profile of the dual damascene conductive structure 31 and the edge profile of the capacitor structure 40 may include substantially the same shape.

In some embodiments, the second hole 222 may be sealed by the top electrode 46, and an air gap 22G may be formed in the second hole 222. In some embodiments, the top electrode 46 may spontaneously seal the second hole 222 due to the smaller dimension of the opening 26H of the cap barrier layer 26, thereby forming an air gap 22G in the second hole 222 as shown in FIG. 4G. The bottom electrode 42, the capacitor dielectric layer 44 and the top electrode 46 may be patterned by photolithography and etching technique to form a capacitor structure 40. In some embodiments, the bottom electrode 42, the capacitor dielectric layer 44 and the top electrode 46 may be patterned by the same photolithography and etching operation. In some embodiments, the bottom electrode 42, the capacitor dielectric layer 44 and the top electrode 46 further extend to cover a top surface 26T of the cap barrier layer 26.

Figure 4H:
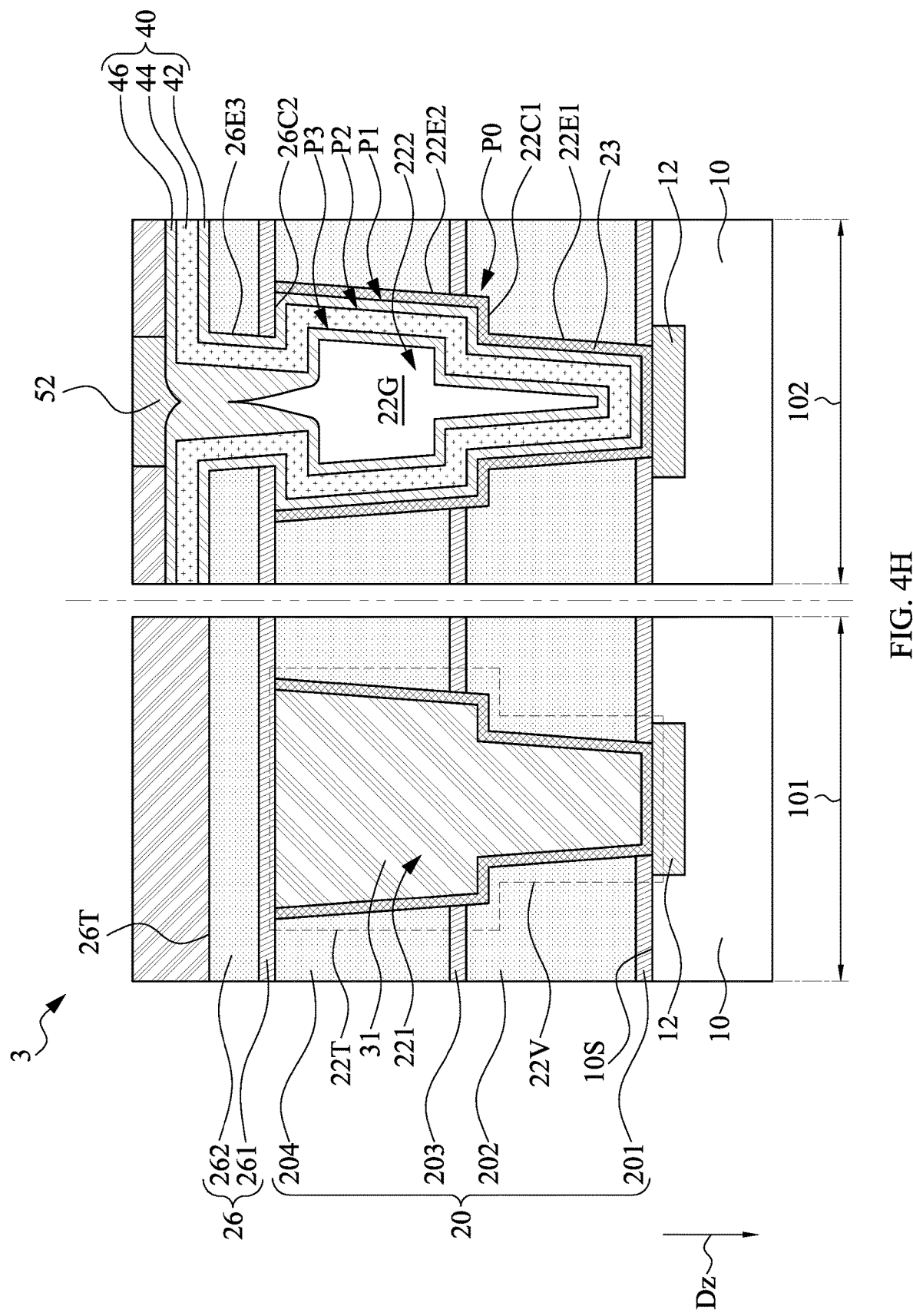

Referring to FIG. 4H, a passivation layer 50 may be formed on the cap barrier layer 26 and exposing the top electrode 46 of the capacitor structure 40. A second conductive layer 52 may be formed on and electrically connected to the top electrode 46 of the capacitor structure 40 to form a semiconductor structure 3 of some embodiments of the present disclosure. In some embodiments, the second conductive layer 52 may be configured as an electrical contact such as a top via to electrically connect the capacitor structure 40 to an electronic component such as an optical sensor (e.g., CIS sensor). The capacitance provided by the capacitor structure 40 can increase full well capacity (FWC) of the optical sensor, and thus can improve the contrast of darkness/brightness (i.e., dynamic range).

In some embodiments, the fabrication of the capacitor structure 40 can be integrated into the manufacturing operations of the dual damascene conductive structure 31, and thus manufacturing costs and complexity can be reduced. The trench portion of the dual damascene shape hole is laterally recessed outwardly, and thus the capacitor structure formed in the dual damascene shape hole can be significantly increased. In an optical sensor application, the capacitor structure 40 with extra capacitance can increase full well capacity (FWC) of the optical sensor, and thus can improve the contrast of darkness/brightness (i.e., dynamic range).

Figure 5:
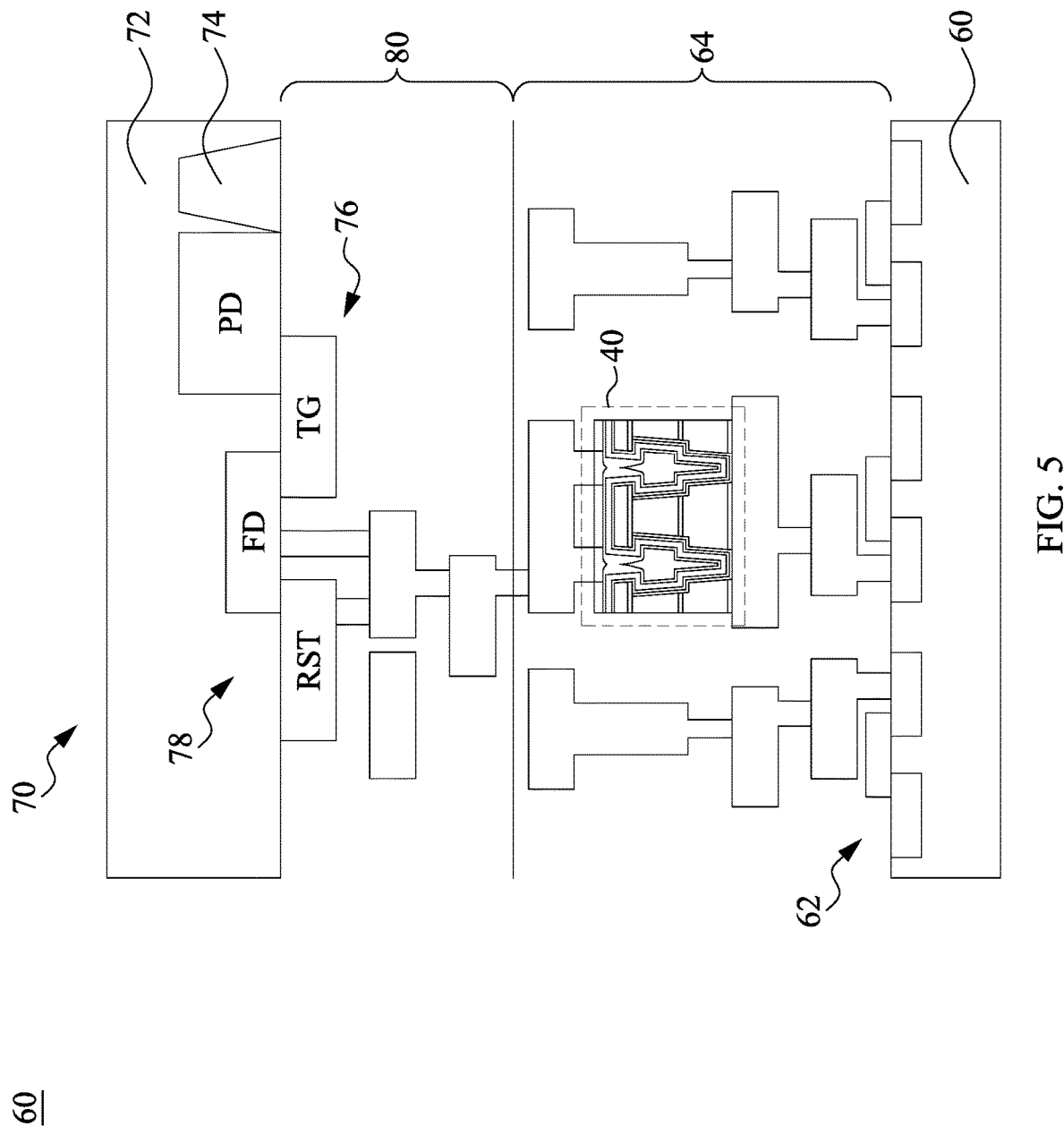
FIG. 5 is a schematic diagram illustrating an integrated circuit in accordance with some embodiments of the present disclosure.

FIG. 5 is a schematic diagram illustrating an integrated circuit in accordance with some embodiments of the present disclosure. As shown in FIG. 5, the integrated circuit 60 may include a first substrate 62, transistors 64 disposed on the first substrate 62, a first interconnection 66 disposed on and electrically connected to the transistors 64, and the capacitor structure 40. The capacitor structure 40 may be embedded in and electrically connected to the first interconnection 66. The capacitor structure 40 may be integrally formed along with the first interconnection 66. The integrated circuit 60 may further include a CIS sensor (CMOS image sensor) 70 disposed over the first interconnection 66. The CIS sensor 70 may include a second substrate 72, isolation structure such as shallow trench isolation (STI) 74, a transfer MOS 76, a reset MOS 78 and a second interconnection 80. The transfer MOS 76 may include a transfer gate TG, a photo diode PD and a floating drain FD. The floating drain FD is shared by the transfer MOS 76 and the reset MOS 78, and electrically connected capacitor structure 40 through the second interconnection 80. In some embodiments, the transistors 64 and the first interconnection 66 may be formed on the first substrate 60, and the CIS sensor 70 may be formed on the second substrate 72 and then bonded to the first interconnection 64. Details of the capacitor structure 40 are for example described in FIGS. 4A-4H and related texts, and are not redundantly described. As shown in FIGS. 4A-4H and FIG. 5, the capacitor structure 40 includes lateral protrusions that can increase the overlapping area, and thus the capacitance can be enhanced by more than 30%. Accordingly, the dynamic range of the CIS sensor 70 can be improved.

In some embodiments of the present disclosure, the semiconductor device uses self-aligned contact via(s) to provide an electrical connection path for the active device. The contact via is formed in an enclosure defined by sidewall spacers of several neighboring active devices, and thus can be formed in a self-aligned manner. The self-aligned contact via can reduce the number of photomasks in the fabrication of the semiconductor device, and thus layout density can be increased, and manufacturing costs can be reduced.

In some embodiments, a semiconductor structure includes a substrate, at least one dielectric layer and a capacitor structure. The at least one dielectric layer is disposed over the substrate, and the at least one dielectric layer includes a step edge profile. The capacitor structure is disposed over the substrate. The capacitor structure includes a bottom electrode, a capacitor dielectric layer and a top electrode. The bottom electrode covers the step edge profile of the at least one dielectric layer and has a first step profile substantially conformal to the step edge profile of the at least one dielectric layer. The capacitor dielectric layer covers the bottom electrode and has a second step profile substantially conformal to the first step profile. The top electrode covers the capacitor dielectric layer.

In some embodiments, a semiconductor structure includes a substrate, at least one dielectric layer over the substrate, a dual damascene conductive structure in the at least one dielectric layer over the substrate, and a capacitor structure in the at least one dielectric layer over the substrate. An edge profile of the dual damascene conductive structure and an edge profile of the capacitor structure include substantially the same shape.

In some embodiments, a method for manufacturing a semiconductor structure is provided. At least one dielectric layer is formed over a substrate. The at least one dielectric layer is patterned to form a first hole and a second hole. Each of the first hole and the second hole includes a via portion, and a trench portion on the via portion and wider than the via portion. A plurality of dual damascene conductive structures are formed in the first hole and the second hole. The dual damascene conductive structure in the second hole is removed. A capacitor structure is formed in the second hole.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   at least one dielectric layer over the substrate, the at least one dielectric layer including a step edge profile;
   a capacitor structure disposed over the substrate, the capacitor structure comprising:
      a bottom electrode covering the step edge profile of the at least one dielectric layer and having a first step profile substantially conformal to the step edge profile of the at least one dielectric layer;
      a capacitor dielectric layer covering the bottom electrode and having a second step profile substantially conformal to the first step profile;
      a top electrode covering the capacitor dielectric layer; and
      an air gap in the capacitor structure; and
   a cap barrier layer over a first portion of the capacitor structure,
   wherein a second portion of the capacitor structure is disposed over the cap barrier layer, and the air gap is separated from the cap barrier layer.

2. The semiconductor structure of claim 1, wherein the top electrode has a third step profile substantially conformal to the second step profile.

3. The semiconductor structure of claim 1, wherein the step edge profile of the at least one dielectric layer comprises a first edge extending substantially along a depth direction of the at least one dielectric layer, a first connection edge connected to and angled with the first edge, and a second edge connected to the first connection edge and extending substantially along the depth direction.

4. The semiconductor structure of claim 3, further comprising a barrier layer covering the first edge, the first connection edge and the second edge of the at least one dielectric layer.

5. The semiconductor structure of claim 3, wherein the cap barrier layer is disposed on the at least one dielectric layer, wherein the cap barrier layer comprises a second connection edge connected to and angled with the second edge, and a third edge connected to the second connection edge and extending substantially along the depth direction.

6. The semiconductor structure of claim 1, wherein the bottom electrode, the capacitor dielectric layer and the top electrode further extend to cover a top surface of the cap barrier layer.

7. The semiconductor structure of claim 1, wherein the top electrode defines the air gap in the at least one dielectric layer.

8. A semiconductor structure, comprising:
   a substrate;
   at least one dielectric layer over the substrate;
   a dual damascene conductive structure in the at least one dielectric layer over the substrate; and
   a capacitor structure in the at least one dielectric layer over the substrate, wherein an edge profile of the dual damascene conductive structure and an edge profile of the capacitor structure include substantially the same shape, and an air gap is sealed by a top electrode of the capacitor structure.

9. The semiconductor structure of claim 8, wherein the dual damascene conductive structure includes a conductive via and a conductive feature disposed on the conductive via, the conductive via and the conductive feature collectively include a step edge profile, and the capacitor structure includes a step edge profile having the same shape as the step edge profile of the dual damascene conductive structure.

10. The semiconductor structure of claim 9, wherein the capacitor structure comprises:
    a bottom electrode including the step edge profile; and
    a capacitor dielectric layer covering the bottom electrode and substantially conformal to the bottom electrode.

11. The semiconductor structure of claim 10, wherein the top electrode is substantially conformal to the capacitor dielectric layer.

12. The semiconductor structure of claim 10, further comprising a cap barrier layer on the at least one dielectric layer, wherein the bottom electrode, the capacitor dielectric layer and the top electrode further extend to cover a top surface of the cap barrier layer.

13. The semiconductor structure of claim 8, further comprising:
    a first barrier layer disposed between the at least one dielectric layer and the dual damascene conductive structure; and
    a second barrier layer disposed between the at least one dielectric layer and the capacitor structure, wherein the first barrier layer and the second barrier layer include the same shape.

14. A semiconductor structure, comprising:
    a substrate;
    at least one dielectric layer over the substrate;
    a capacitor structure disposed in the dielectric layer, the capacitor structure comprising:
       a bottom electrode;

a capacitor dielectric layer covering the bottom electrode;

a top electrode covering the capacitor dielectric layer; and an air gap sealed by the top electrode; and a conductive layer disposed over and coupled to the capacitor structure.

15. The semiconductor structure of claim 14, wherein the at least one dielectric layer including a step edge profile, the bottom electrode has a first step profile substantially conformal to the step edge profile of the at least one dielectric layer, the capacitor dielectric layer has a second step profile substantially conformal to the first step profile of the bottom electrode, and the top electrode has a third step profile substantially conformal to the second step profile of the capacitor dielectric layer.

16. The semiconductor structure of claim 15, wherein the step edge profile of the at least one dielectric layer comprises a first edge extending substantially along a depth direction of the at least one dielectric layer, a first connection edge connected to and angled with the first edge, and a second edge connected to the first connection edge and extending substantially along the depth direction.

17. The semiconductor structure of claim 16, further comprising a barrier layer covering the first edge, the first connection edge and the second edge of the at least one dielectric layer.

18. The semiconductor structure of claim 16, further comprising a cap barrier layer on the at least one dielectric layer, wherein the cap barrier layer comprises a second connection edge connected to and angled with the second edge, and a third edge connected to the second connection edge and extending substantially along the depth direction.

19. The semiconductor structure of claim 18, wherein the bottom electrode, the capacitor dielectric layer and the top electrode further extend to cover a top surface of the cap barrier layer.

20. The semiconductor structure of claim 14, wherein the conductive layer is electrically connected to the top electrode of the capacitor structure.

* * * * *